(12) United States Patent
Lee et al.

(10) Patent No.: US 9,368,566 B2
(45) Date of Patent: Jun. 14, 2016

(54) PACKAGE ON PACKAGE (POP) INTEGRATED DEVICE COMPRISING A CAPACITOR IN A SUBSTRATE

(71) Applicant: QUALCOMM Incorporated, San Diego, CA (US)

(72) Inventors: Jong-Hoon Lee, San Diego, CA (US); Young Kyu Song, San Diego, CA (US); Daeik Daniel Kim, San Diego, CA (US); Jung Ho Yoon, San Diego, CA (US); Uei-Ming Jow, San Diego, CA (US); Mario Francisco Velez, San Diego, CA (US); Jonghae Kim, San Diego, CA (US); Xiaonan Zhang, San Diego, CA (US); Ryan David Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/334,521

(22) Filed: Jul. 17, 2014

(65) Prior Publication Data

US 2016/0020193 A1    Jan. 21, 2016

(51) Int. Cl.
*H01L 29/00* (2006.01)
*H01L 49/02* (2006.01)
*H01L 23/538* (2006.01)
*H01L 23/00* (2006.01)

(52) U.S. Cl.
CPC ............ *H01L 28/40* (2013.01); *H01L 23/5389* (2013.01); *H01L 24/19* (2013.01); *H01L 2224/12105* (2013.01); *H01L 2224/32225* (2013.01); *H01L 2224/73267* (2013.01); *H01L 2224/92244* (2013.01); *H01L 2924/15311* (2013.01)

(58) Field of Classification Search
CPC . H01L 25/105; H01L 23/498; H01L 23/3128; H01L 2225/06565; H01L 2224/45139; H01L 2225/06541; H01L 2225/06513; H01L 2225/06517; H01L 23/49816; H01L 2225/1058; H01L 2225/1023; H01L 2924/18161; H01L 23/5389; H01L 24/19; H01L 24/20; H01L 25/55; H01L 24/11; H01L 24/81
USPC ......... 257/532, 686, 737–738, 774, 777, 786; 438/103–107, 393, 396
See application file for complete search history.

(56) References Cited

U.S. PATENT DOCUMENTS

| | | | |
|---|---|---|---|
| 7,049,692 B2 | 5/2006 | Nishimura et al. | |
| 7,781,879 B1 | 8/2010 | Rahman et al. | |
| 8,526,186 B2 | 9/2013 | Yokoya et al. | |
| 2009/0128993 A1* | 5/2009 | Wu | H01G 4/232 361/329 |
| 2010/0327433 A1* | 12/2010 | Sweeney | H01G 4/33 257/724 |
| 2013/0090097 A1* | 4/2013 | Klassen | H04L 67/06 455/414.1 |

(Continued)

*Primary Examiner* — Dung Le
(74) *Attorney, Agent, or Firm* — Loza & Loza, LLP

(57) ABSTRACT

Some features pertain to an integrated device (e.g., package-on-package (PoP) device) that includes a substrate, a first die, a first encapsulation layer, a first redistribution portion, a second die, a second encapsulation layer, and a second redistribution portion. The substrate includes a first surface and a second surface. The substrate includes a capacitor. The first die is coupled to the first surface of the substrate. The first encapsulation layer encapsulates the first die. The first redistribution portion is coupled to the first encapsulation. The second die is coupled to the second surface of the substrate. The second encapsulation layer encapsulates the second die. The second redistribution portion is coupled to the second encapsulation layer.

20 Claims, 18 Drawing Sheets

(56) References Cited

U.S. PATENT DOCUMENTS

| | | |
|---|---|---|
| 2013/0181325 A1 | 7/2013 | Chen et al. |
| 2013/0256836 A1 | 10/2013 | Hsiao et al. |
| 2014/0084487 A1* | 3/2014 | Zhao ................ H01L 25/105 257/777 |
| 2014/0093999 A1* | 4/2014 | Teh .................... H01L 21/568 438/107 |
| 2014/0139969 A1* | 5/2014 | Hwang ............... H01G 4/012 361/301.1 |
| 2015/0195905 A1* | 7/2015 | Kang .................. H05K 1/0298 361/763 |

* cited by examiner

Metal Layer(s) formed using Semi-Additive Patterning (SAP) Process

Metal Layer(s) formed using Damascene Process

Semi-Additive Patterning (SAP) Process

PACKAGE ON PACKAGE (POP) INTEGRATED DEVICE COMPRISING A CAPACITOR IN A SUBSTRATE

BACKGROUND

1. Field

Various features relate to a package on package (PoP) integrated device comprising a capacitor in a substrate.

2. Background

FIG. 1 illustrates a conventional package on package (PoP) integrated device. As shown in FIG. 1, the integrated device 100 includes a first package 102 and a second package 104. The first package 102 includes a first substrate 106, a first die (e.g., chip) 108, a first set of solder balls 116, a first set of interconnects 118, and a capacitor 120. The first substrate 106 may include traces and/or vias (both of which are not shown). The second package 104 includes a second substrate 105, a second die 107, a third die 109, a second set of solder balls 115, a first set of wire bonding 117, and a second set of wire bonding 119. The second substrate 105 may include traces and/or vias (both of which are not shown). The second package 104 is positioned above the first package 102.

The first die 108 is coupled to a first surface (e.g., top surface) of the first substrate 106 through the first set of interconnects 118. The first set of solder balls 116 is coupled to a second surface (e.g., bottom surface) of the first substrate 106. The first substrate 106 includes a set of traces and/or vias that may electrically connect to the first die 108 and/or the first set of solder balls 116. The capacitor 120 is a surface mounted passive device on a surface of the substrate 106.

The second die 107 and the third die 109 are coupled to a first surface (e.g., top surface) of the second substrate 105. The second die 107 is electrically coupled to the traces and/or vias of the second substrate 105 through the first set of wire bonding 117. The third die 109 is electrically coupled to the traces and/or vias of the second substrate 105 through the second set of wire bonding 119. The second set of solder balls 115 is coupled to a second surface (e.g., bottom surface) of the second substrate 105.

One major drawback of the package on package (PoP) configuration shown in FIG. 1 is that it creates an integrated device with a form factor that may be too large for the needs of mobile computing devices. For example, the location of the capacitor 120 may limit how small the integrated device can be. This may result in a package that is either too large and/or too thick. That is, the PoP configuration shown in FIG. 1 may be too thick and/or have a surface area that is too large to meet the needs and/or requirements of mobile computing devices.

Therefore, there is a need for an integrated device that includes an improved PoP configuration. Ideally, such an integrated device will have a better form factor, while at the same time meeting the needs and/or requirements of mobile computing devices. Moreover, such an improved PoP configuration would provide better integrated device performance (e.g., better signal, better channel, better electrical speed performance).

SUMMARY

Various features, apparatus and methods described herein provide a package on package (PoP) integrated device comprising several solder resist layers.

A first example provides an integrated device that includes a substrate, a first die, a first encapsulation layer, a first redistribution portion, a second die, a second encapsulation layer, and a second redistribution portion. The substrate includes a first surface and a second surface. The substrate includes a capacitor. The first die is coupled to the first surface of the substrate. The first encapsulation layer encapsulates the first die. The first redistribution portion is coupled to the first encapsulation layer. The second die is coupled to the second surface of the substrate. The second encapsulation layer encapsulates the second die. The second redistribution portion is coupled to the second encapsulation layer.

According to an aspect, the capacitor includes one of at least a plate capacitor and/or an embedded package substrate (EPS) capacitor.

According to one aspect, the first redistribution portion includes a redistribution interconnect.

According to an aspect, the first encapsulation layer includes a through encapsulation via.

According to one aspect, the first encapsulation layer includes a photo-etchable material.

According to an aspect, the substrate is a hybrid substrate that includes a first dielectric layer and a second dielectric layer. In some implementations, the second dielectric layer has a second k value that is substantially greater than the first k value of the first dielectric layer.

According to one aspect, the integrated device includes a first redistribution interconnect, a first through encapsulation via (TEV), a first via, a first pad, a second TEV, and a second redistribution interconnect. The first redistribution interconnect is in the first redistribution portion. The first redistribution portion is coupled to the first die through a first die interconnect. The first through encapsulation via (TEV) is in the first encapsulation layer. The first TEV is coupled to the first redistribution interconnect. The first via is in the substrate. The first via is coupled to the first TEV. The first pad is in the substrate. The first pad is coupled to the first via. The second TEV is in the second encapsulation layer. The second TEV is coupled to the first pad. The second redistribution interconnect is in the second redistribution portion. The second redistribution interconnect is coupled to the second TEV.

According to an aspect, the integrated device is one of at least a package and/or package on package (POP) device.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a method for fabricating an integrated device. The method provides a substrate that includes a first surface, a second surface, and a capacitor. The method couples a first die to the first surface of the substrate. The method forms a first encapsulation layer that encapsulates the first die. The method forms a first redistribution portion on the first encapsulation layer. The method couples a second die to the second surface of the substrate. The method forms a second encapsulation layer that encapsulates the second die. The method forms a second redistribution portion on the second encapsulation layer.

According to an aspect, the capacitor includes one of at least a plate capacitor and/or an embedded package substrate (EPS) capacitor.

According to one aspect, forming the first redistribution portion includes forming a redistribution interconnect.

According to an aspect, forming the first encapsulation layer includes forming a through encapsulation via.

According to one aspect, the first encapsulation layer includes a photo-etchable material.

According to an aspect, providing the substrate includes providing a hybrid substrate that includes a first dielectric layer and a second dielectric layer. In some implementations, the second dielectric layer has a second k value that is substantially greater than the first k value of the first dielectric layer.

According to one aspect, the method forms a first redistribution interconnect in the first redistribution portion such that the first redistribution portion is coupled to the first die through a first die interconnect. The method forms a first through encapsulation via (TEV) in the first encapsulation layer such that the first TEV is coupled to the first redistribution interconnect. The method forms a first via in the substrate such that the first via is coupled to the first TEV. The method forms a first pad in the substrate such that the first pad is coupled to the first via. The method forms a second TEV in the second encapsulation layer such that the second TEV is coupled to the first pad. The method forms a second redistribution interconnect in the second redistribution portion such that the second redistribution interconnect is coupled to the second TEV.

According to an aspect, the integrated device is one of at least a package and/or package on package (POP) device.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

Figure 10A:
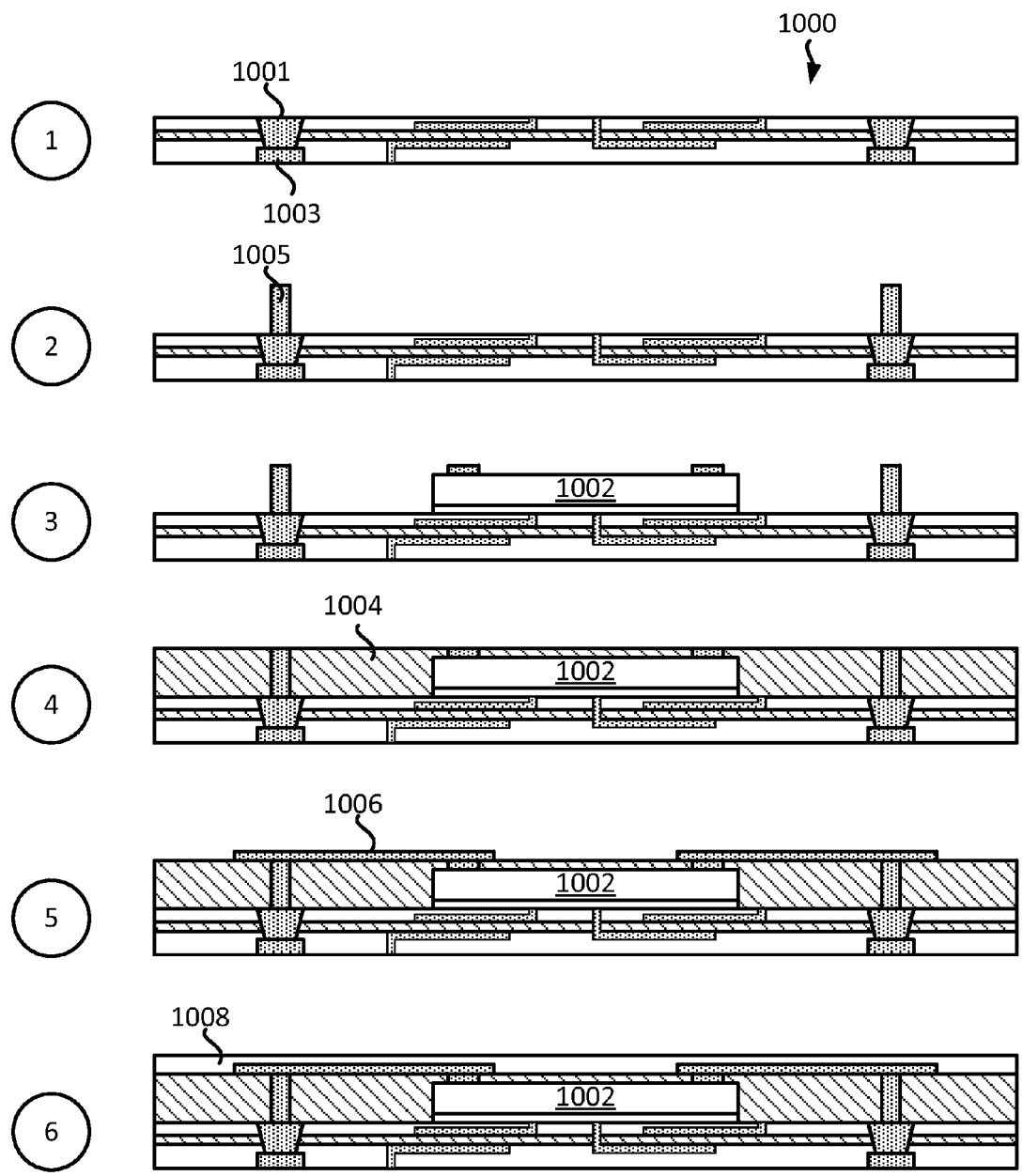
Figure 10B:
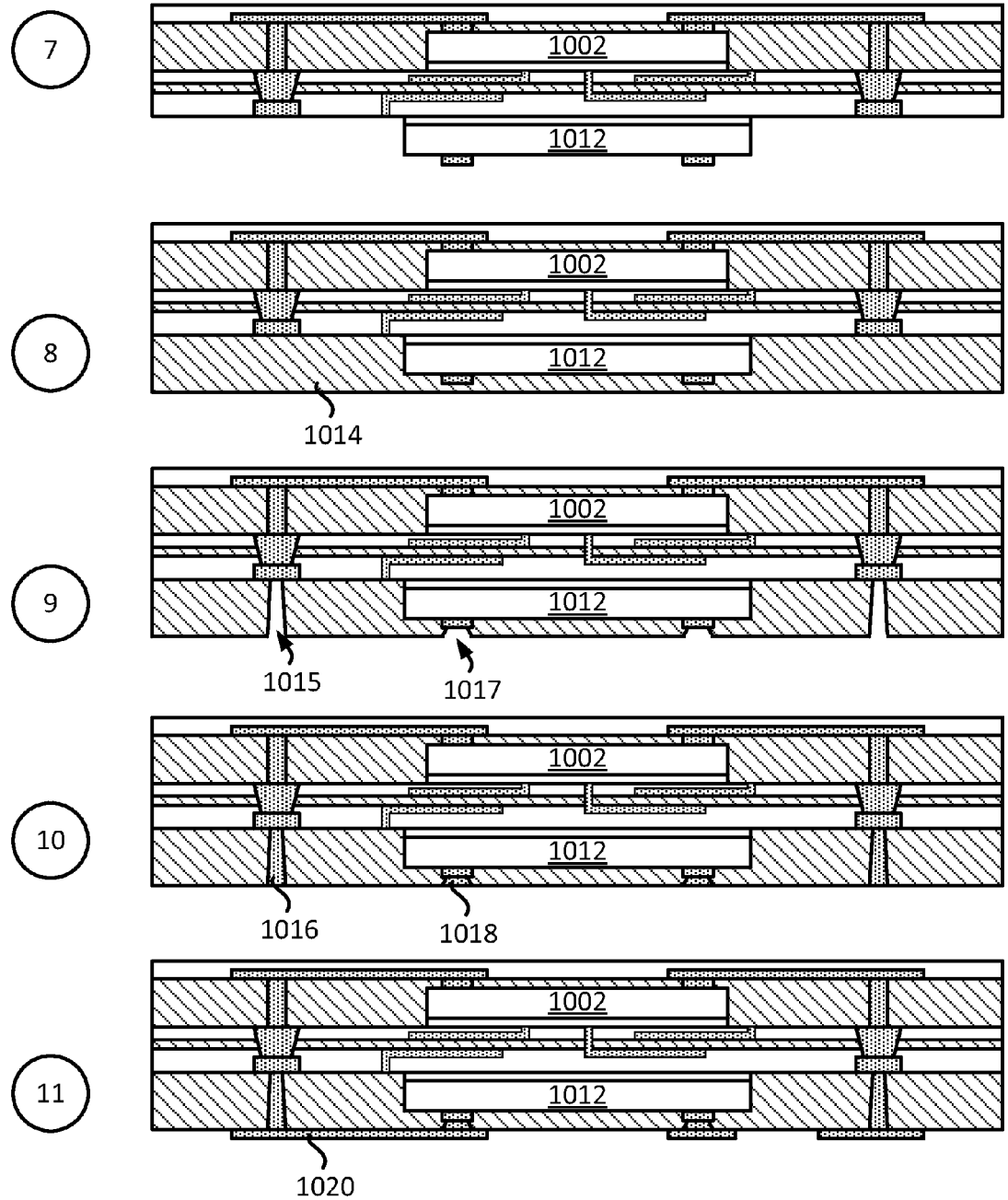
Figure 10C:
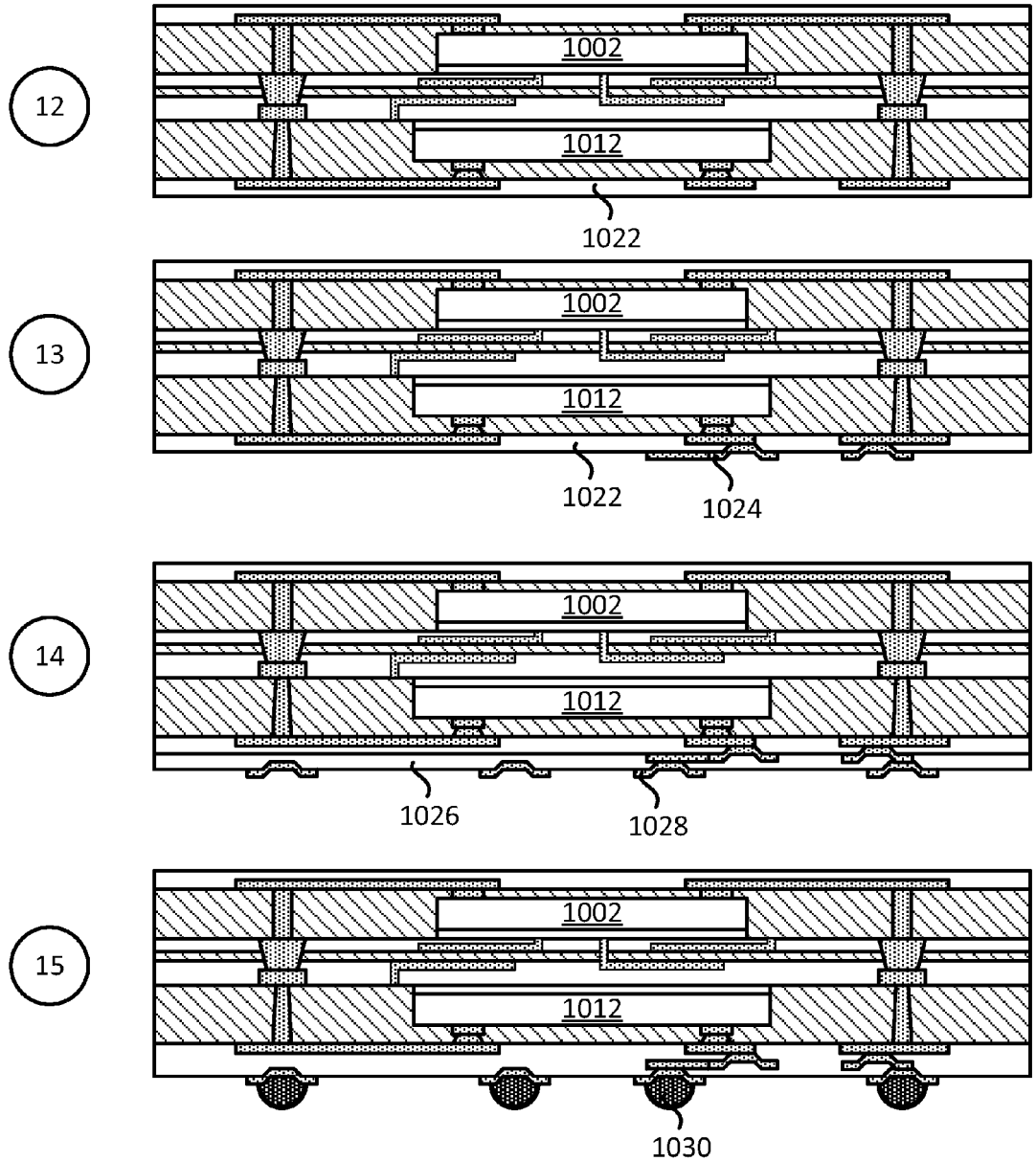

FIG. 10 (comprising FIG. 10A, FIG. 10B, and FIG. 10C) illustrates an example of a sequence for fabricating a package on package (PoP) integrated device that includes a substrate with a capacitor.

Figure 11:
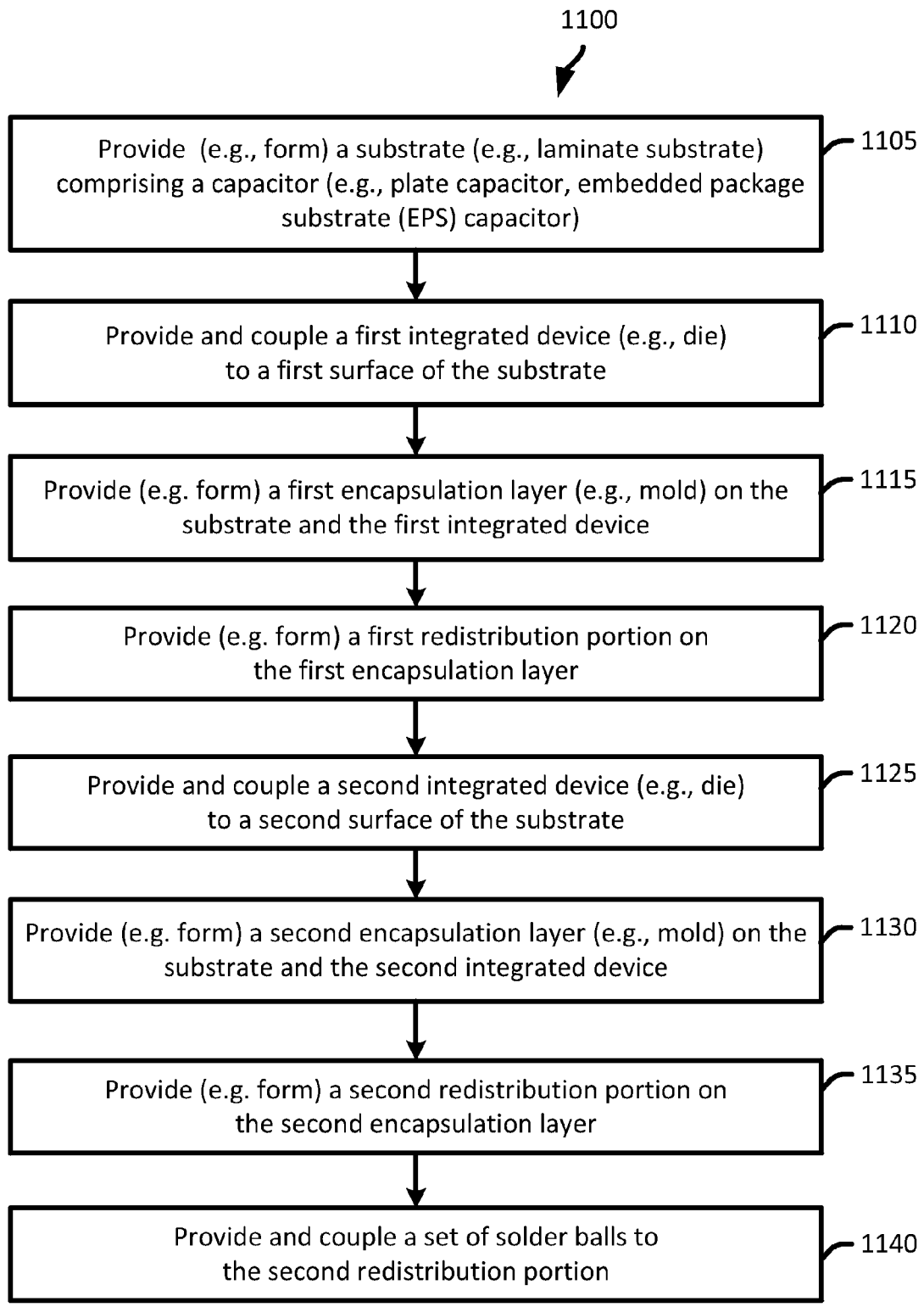

FIG. 11 illustrates an example of a flow diagram of a method for fabricating a package on package (PoP) integrated device that includes a substrate with a capacitor.

Figure 12:
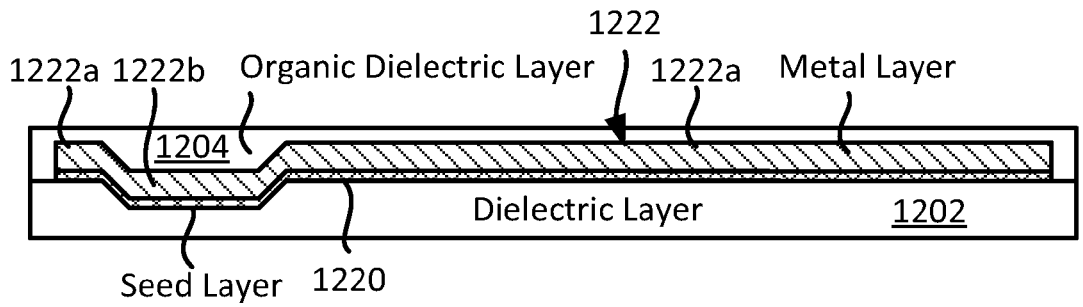

FIG. 12 illustrates an example of a metal layer (e.g., interconnect) formed using a semi-additive patterning (SAP) process.

Figure 13:
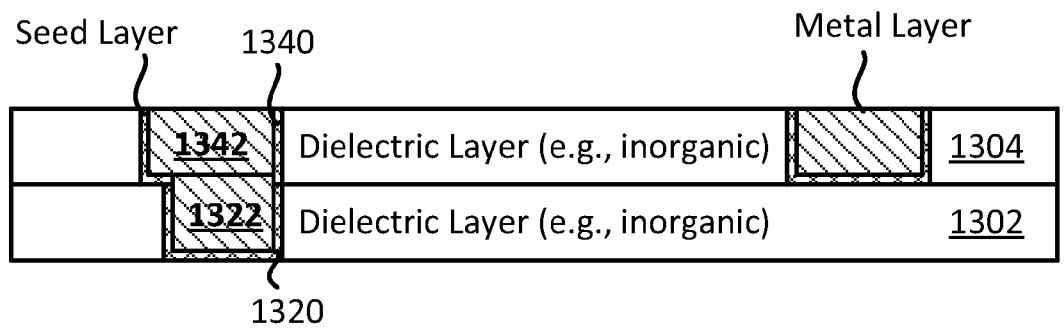

FIG. 13 illustrates an example of metal layers formed using a damascene process.

Figure 14:
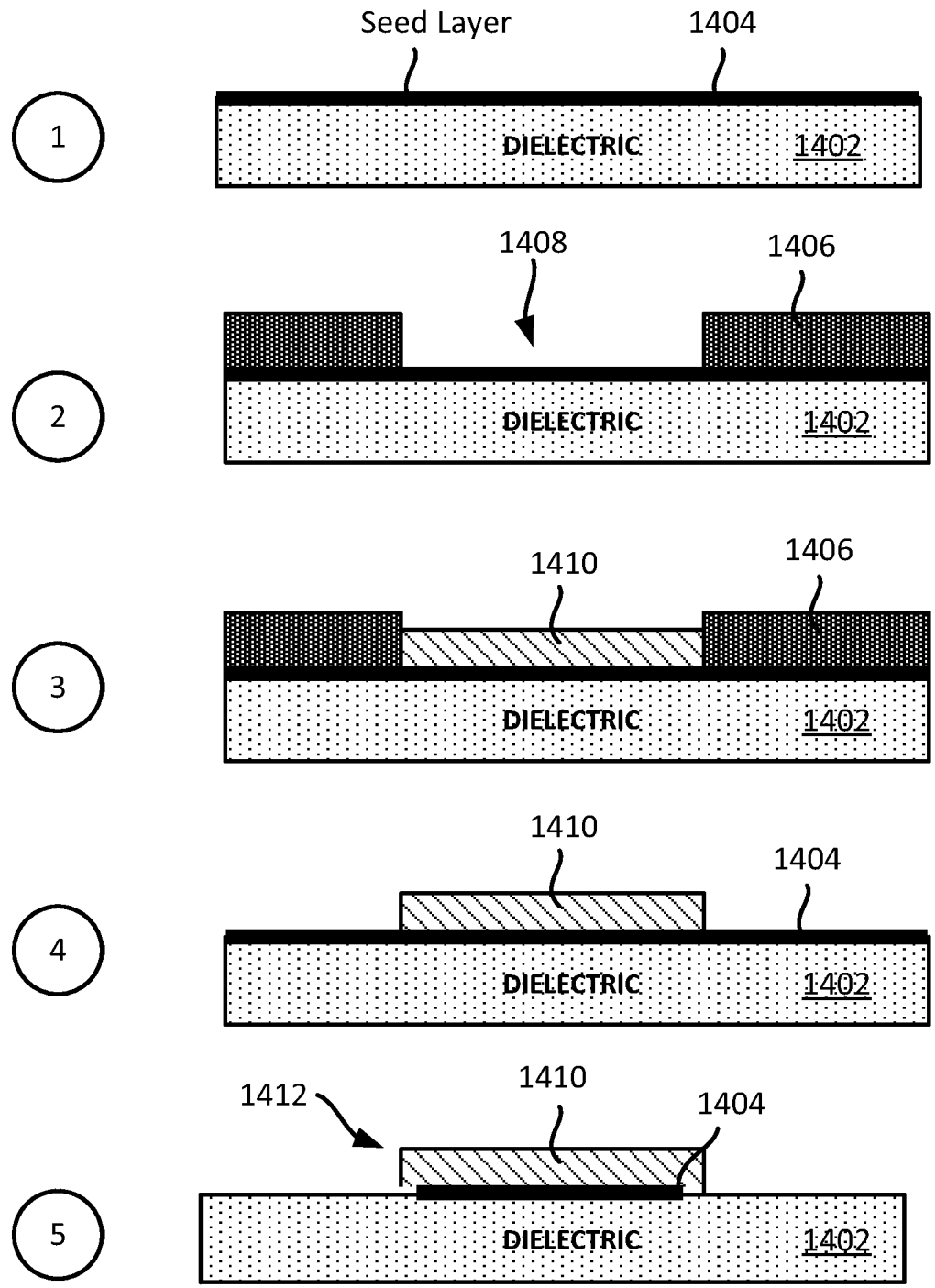

FIG. 14 illustrates an example of a semi-additive patterning (SAP) process.

Figure 15:
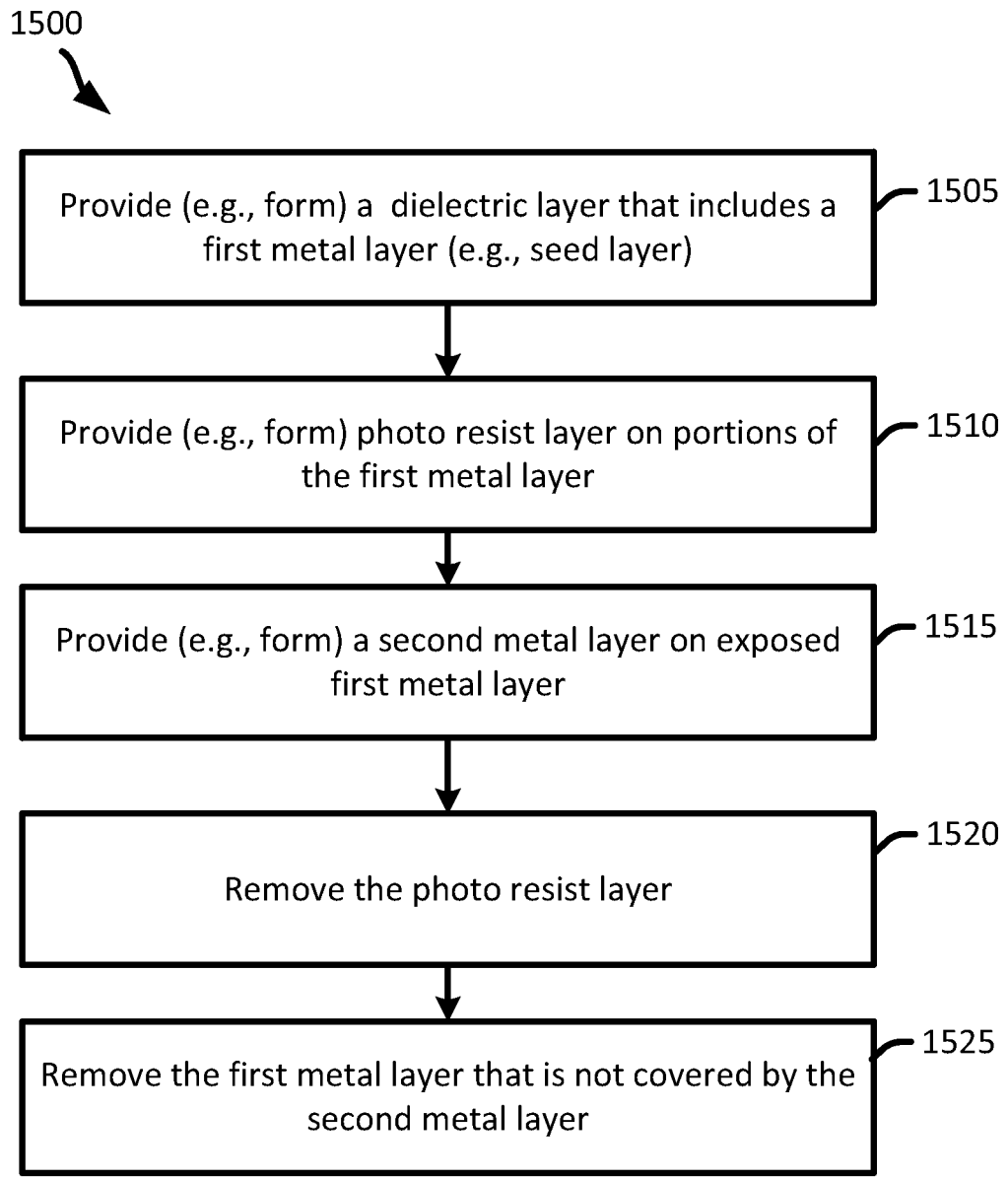

FIG. 15 illustrates an example of flow diagram of a semi-additive patterning (SAP) process.

Figure 16:
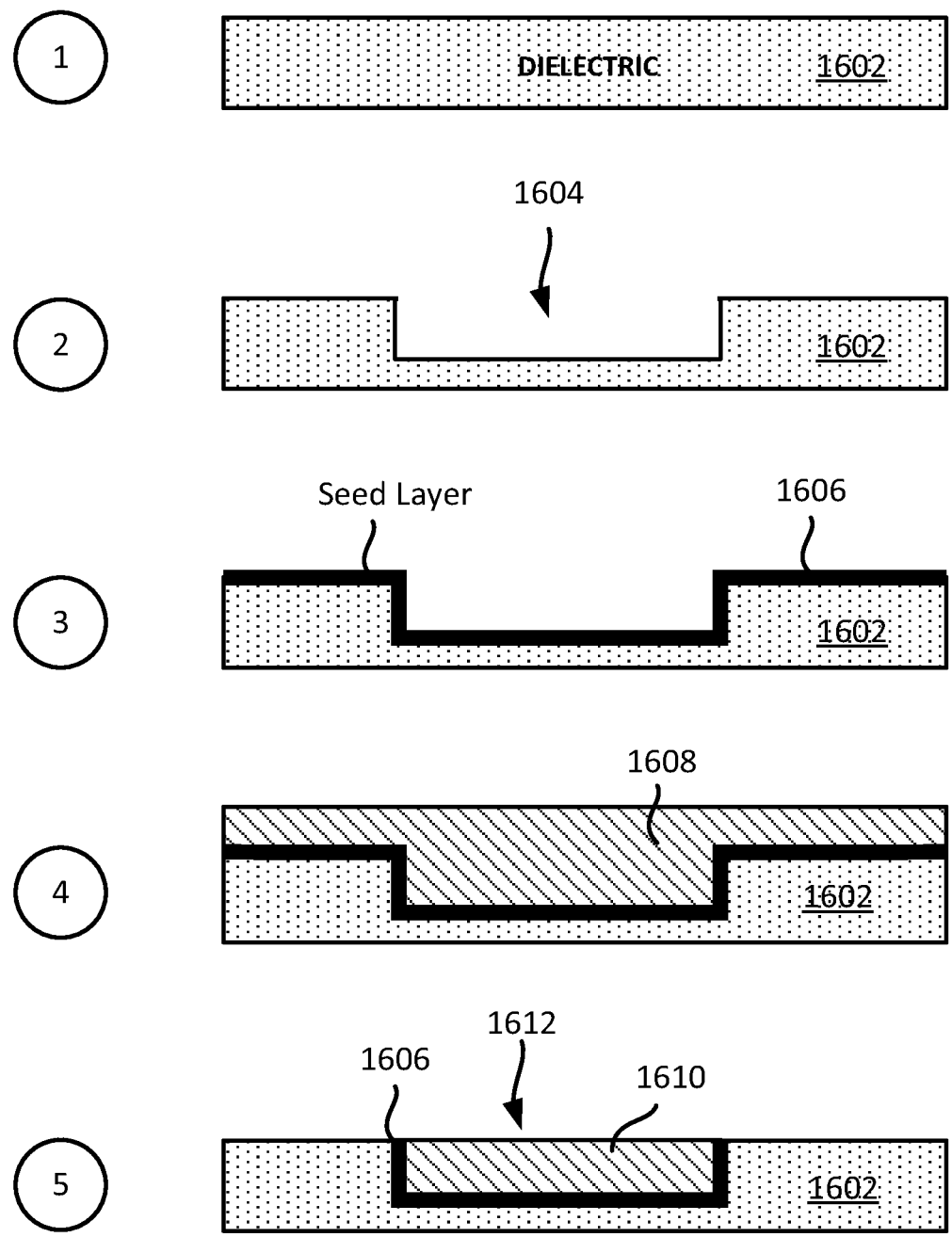

FIG. 16 illustrates an example of a damascene process.

Figure 17:
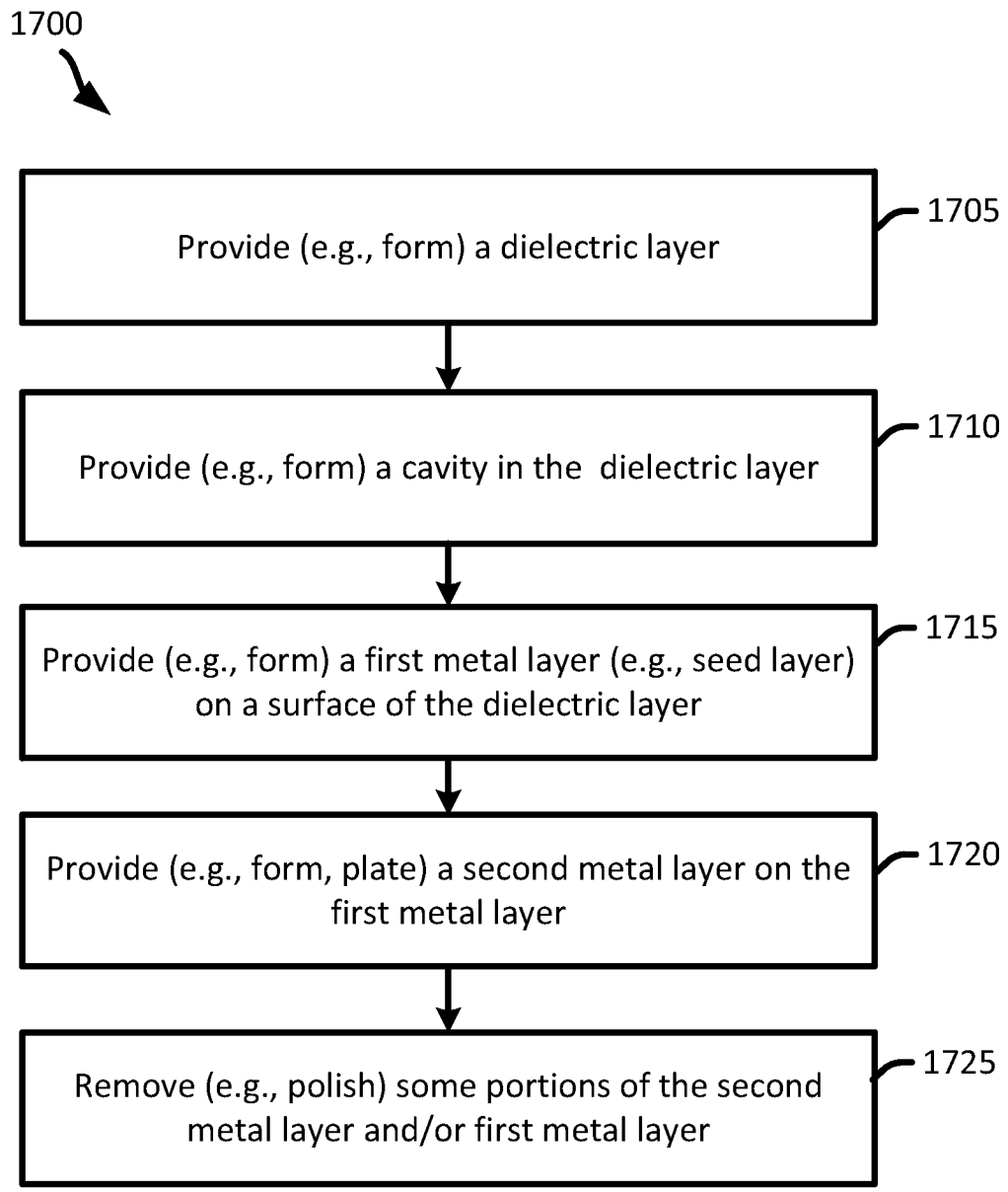

FIG. 17 illustrates an example of a flow diagram of a damascene process.

Figure 18:
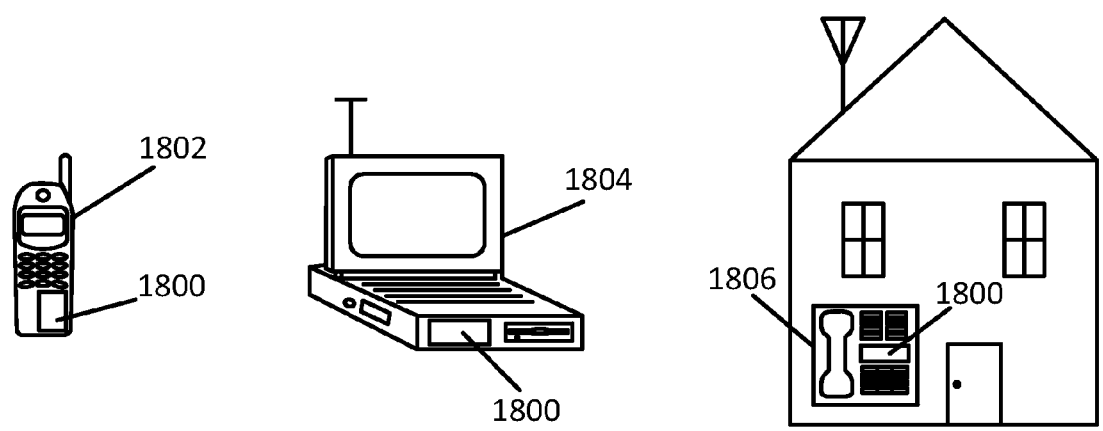

FIG. 18 illustrates various electronic devices that may integrate a semiconductor device, a die, an integrated circuit and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain to an integrated device (e.g., integrated package device, package-on-package (PoP) device) that includes a substrate, a first die, a first encapsulation layer, a first redistribution portion, a second die, a second encapsulation layer, and a second redistribution portion. The substrate includes a first surface and a second surface. The substrate includes a capacitor. The first die is coupled to the first surface of the substrate. The first encapsulation layer encapsulates the first die. The first redistribution portion is coupled to the first encapsulation. The second die is coupled to the second surface of the substrate. The second encapsulation layer encapsulates the second die. The second redistribution portion is coupled to the second encapsulation layer. In some implementations, the capacitor includes one of at least a plate capacitor and/or an embedded package substrate (EPS) capacitor. In some implementations, the substrate is a hybrid substrate that includes a first dielectric layer and a second dielectric layer. In some implementations, the second dielectric layer has a second k value that is substantially greater than the first k value of the first dielectric layer. In some implementations, the first redistribution portion includes a redistribution interconnect. In some implementations, the first encapsulation layer includes a through encapsulation via (TEV). In some implementations, the first encapsulation layer includes a photo-etchable material.

Terms and Definitions

An interconnect is an element or component that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

Figure 1:
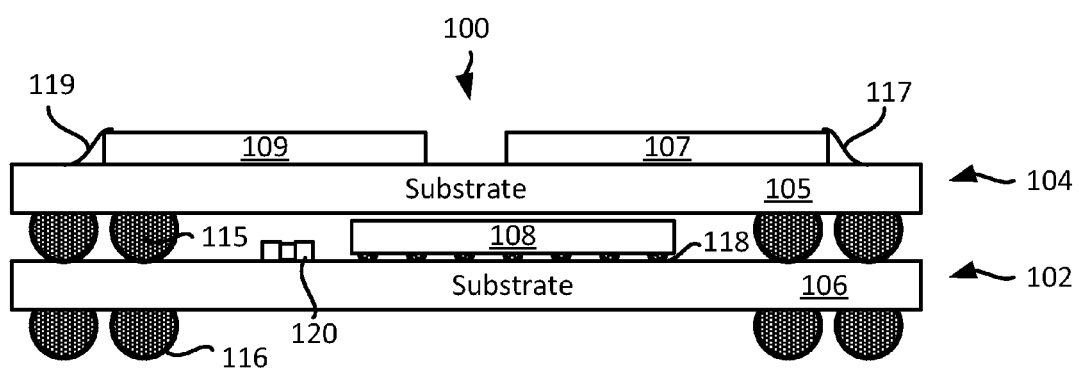
FIG. 1 illustrates a conventional package on package (PoP) integrated device.
Figure 2:
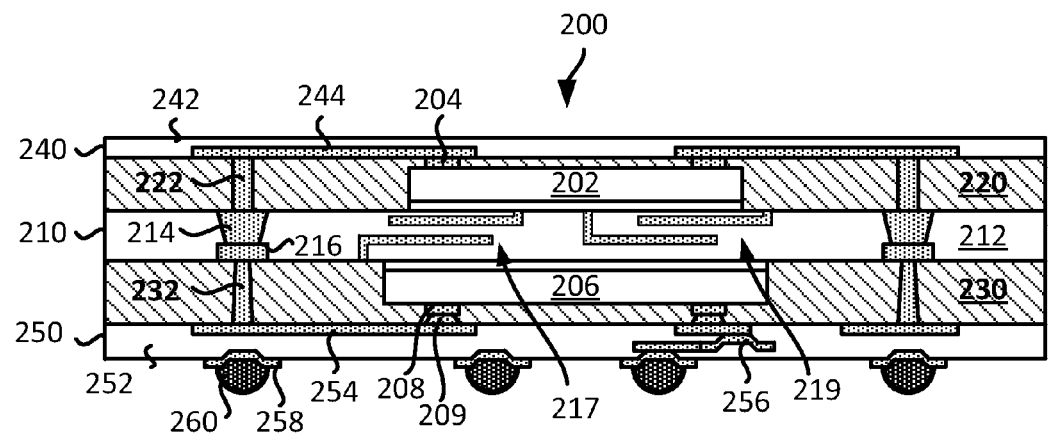
FIG. 2 illustrates an example of a package on package (PoP) integrated device that includes a substrate with a capacitor.

Exemplary Package on Package (PoP) Integrated Device that Includes a Capacitor in a Substrate FIG. 2 illustrates an exemplary package on package (PoP) integrated device 200 that includes a capacitor in a substrate. As shown in FIG. 2, the integrated device 200 (e.g., integrated package device) includes a first die 202, a second die 206, a substrate 210, a first encapsulation layer 220, a second encapsulation layer 230, a first redistribution portion 240, and a second redistribution portion 250.

The substrate 210 includes a dielectric layer 212, a via 214, a pad 216, a first capacitor 217 and a second capacitor 219. In some implementations, the substrate 210 is a laminate substrate. The substrate 210 includes a first surface (e.g., top surface) and a second surface (e.g., bottom surface). In some implementations, the dielectric layer 212 may include several dielectric layers. In some implementations, the dielectric layers may be the same material. The via 214 is coupled to the pad 216. In some implementations, the combination of the via 214 and the pad 216 traverses from the first surface of the substrate 210 to the second surface of the substrate 210. In some implementations, the via 214 and/or the pad 216 is a form of an interconnect that traverses the substrate 210.

In some implementations, the first capacitor 217 is a first plate capacitor. In some implementations, the second capacitor 219 is a second plate capacitor 219. In some implementations, a plate capacitor is defined by two interconnects separated by a gap. In some implementations, the gap is defined by one or more dielectric layers. The first and second capacitors 217 and 219 are further described in detail below in FIG. 3.

The first die 202 includes a back side and a front side (e.g., active side). The front side is coupled to a set of die interconnects 204. The set of die interconnects 204 may be one of at least pads and/or pillars in some implementations. The back side of the first die 202 is coupled to the first surface of the substrate 210. In some implementations, a bonding agent (e.g., glue) is used to couple the back side of the first die 202 to the first surface of the substrate 210. As shown in FIG. 2, the back side of the first die 202 is facing the substrate 210 while the front side (e.g., active side) of the first die 202 is facing away from the substrate 210.

The first encapsulation layer 220 encapsulates the first die 202 and the set of die interconnects 204. In some implementations, the first encapsulation layer 220 is one of at least a mold, a polymer, and/or a photo-etchable material. In some implementations, a photo-etchable material is a material that may be etched through a photo etching process. The first encapsulation layer 220 includes a set of interconnects 222. In some implementations, the set of interconnects 222 is one of at least a through encapsulation via (TEV) and/or a through mold via (TMV). In some implementations, the set of interconnects 222 traverses from a first surface (e.g., top surface) of the first encapsulation layer 220 to a second surface (e.g., bottom surface) of the first encapsulation layer 220. FIG. 2 illustrates that a portion of the set of interconnects 222 in the first encapsulation layer 220 is coupled to the via 214 in the substrate 210.

The first redistribution portion 240 is coupled to the first surface of the first encapsulation layer 220. The first redistribution portion 240 includes a second dielectric layer 242 and a first set of redistribution interconnects 244. In some implementations, the first redistribution portion 240 may include more than one set of redistribution interconnects. The first set of redistribution interconnects 244 is coupled to the set of die interconnects 204 and the set of interconnects 222. In some implementations, the second dielectric layer 242 includes one or more dielectric layers.

The second die 206 includes a back side and a front side (e.g., active side). The front side is coupled to a set of interconnects 208. The set of interconnects 208 may be one of at least pads and/or pillars in some implementations. The back side of the second die 206 is coupled to the second surface of the substrate 210. In some implementations, a bonding agent (e.g., glue) is used to couple the back side of the second die 206 to the second surface of the substrate 210. As shown in FIG. 2, the back side of the second die 206 is facing the substrate 210 while the front side (e.g., active side) of the second die 206 is facing away from the substrate 210.

The second encapsulation layer 230 encapsulates the second die 206 and the set of interconnects 208. In some implementations, the second encapsulation layer 230 is one of at least a mold, a polymer, and/or a photo-etchable material. In some implementations, a photo-etchable material is a material that may be etched through a photo etching process. The second encapsulation layer 230 includes a set of interconnects 232 and a set of interconnects 209. In some implementations, the set of interconnects 232 is one of at least a through encapsulation via (TEV) and/or a through mold via (TMV). In some implementations, the set of interconnects 232 traverses from a first surface (e.g., top surface) of the second encapsulation layer 230 to a second surface (e.g., bottom surface) of the second encapsulation layer 230. FIG. 2 illustrates that a portion of the set of interconnects 232 in the second encapsulation layer 230 is coupled to the pad 216 in the substrate 210. In some implementations, the set of interconnects 209 is one of at least a through encapsulation via (TEV) and/or a through mold via (TMV). The set of interconnects 209 is coupled to the set of interconnects 208.

The second redistribution portion 250 is coupled to the first surface of the second encapsulation layer 230. The second redistribution portion 250 includes a third dielectric layer 252, a second set of redistribution interconnects 254, a third set of redistribution interconnects 256, and a set of under bump metallization (UBM) layers 258. In some implementations, the second redistribution portion 250 may include one, two, or more than two sets of redistribution interconnects. The first set of redistribution interconnects 254 is coupled to the set of interconnects 209 and the set of interconnects 232. In some implementations, the third dielectric layer 252 includes one or more dielectric layers.

A set of solder balls 260 is coupled to the set of UBM layers 258. In some implementations, the UBM layers 258 are optional. In such instances, the set of solder balls 260 may be directly coupled to one of the redistribution interconnects.

Figure 3:
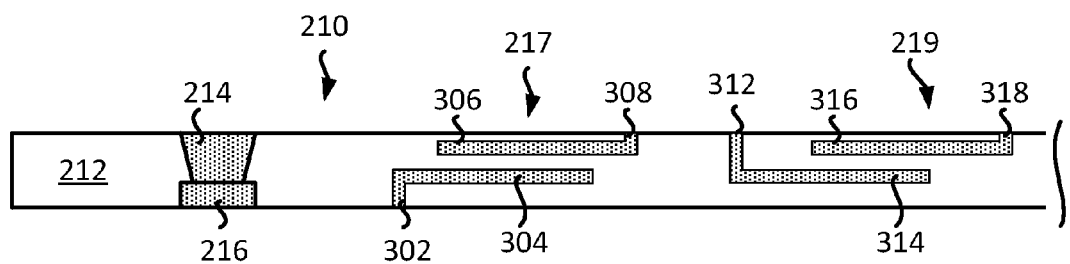
FIG. 3 illustrates a close-up view of an example of a substrate with a capacitor.

FIG. 3 illustrates a close-up view of a portion of the substrate 210 of FIG. 2. As shown in FIG. 3, the substrate 210 includes the dielectric layer 212, the via 214, the pad 216, the first capacitor 217 and the second capacitor 219. In some implementations, the substrate 210 is a laminate substrate. The substrate 210 includes a first surface (e.g., top surface) and a second surface (e.g., bottom surface). In some implementations, the dielectric layer 212 may include several dielectric layers. The via 214 is coupled to the pad 216. In some implementations, the combination of the via 214 and the pad 216 traverses from the first surface of the substrate 210 to the second surface of the substrate 210. In some implementations, the via 214 and/or the pad 216 is a form of an interconnect that traverses the substrate 210.

It should be noted that the substrate 210 may include additional interconnects (e.g., traces, vias), which are not shown for the purpose of clarity. These un-shown (or not visible) interconnects may couple the capacitors 217 and/or 219 to the via 214 and/or pad 216 in some implementations. In some implementations, at least one of the capacitors 217 and/or 219 may be electrically coupled to at least the first die 202 and/or the second die 206. For example, the capacitor 217 may be electrically coupled to the first die 202 through the via 214, the interconnect 222, the interconnect 244, and/or the interconnect 204. Similarly, the capacitor 217 may be electrically coupled to the second die 206 through the via 214, the pad 216, the interconnect 232, the interconnect 254, the interconnect 208, and/or the interconnect 209.

In some implementations, the first capacitor 217 is a first plate capacitor. As shown in FIG. 3, the first capacitor 217 includes a first via 302, a first interconnect 304, a second interconnect 306, and a second via 308. In some implementations, the first via 302 is a first terminal of the first capacitor 217. In some implementations, the first interconnect 304 is a first plate of the first capacitor 217. In some implementations, the second interconnect 306 is a second plate of the first capacitor 217. In some implementations, the second via 308 is a second terminal of the first capacitor 217. In some implementations, the first interconnect 304 and the second interconnect 306 are at least substantially parallel to each other. As shown in FIG. 3, the first interconnect 304 and the second interconnect 306 are separated by a gap and/or spacing. The gap and/or spacing is filled with a layer of the dielectric layer 212. In some implementations, each of the first and second vias 302 and 308 may include one or more vias, or a combination of interconnects, vias, and/or pads.

In some implementations, the second capacitor 219 is a second plate capacitor. As shown in FIG. 3, the second capacitor 219 includes a third via 312, a third interconnect 314, a fourth interconnect 316, and a fourth via 318. In some implementations, the third via 312 is a first terminal of the second capacitor 219. In some implementations, the third interconnect 314 is a first plate of the second capacitor 219. In some implementations, the fourth interconnect 316 is a second plate of the second capacitor 219. In some implementations, the fourth via 318 is a second terminal of the second capacitor 219. In some implementations, the third interconnect 314 and the fourth interconnect 316 are at least substantially parallel to each other. As shown in FIG. 3, the third interconnect 314 and the fourth interconnect 316 are separated by a gap and/or spacing. The gap and/or spacing is filled with a layer of the dielectric layer 212. In some implementations, each of the third and fourth vias 312 and 318 may include one or more vias, or a combination of interconnects, vias, and/or pads.

In some implementations, the second capacitor 219 is a second plate capacitor 219. In some implementations, a plate capacitor is defined by two interconnects separated by a gap. In some implementations, the gap is defined by one or more dielectric layers.

It should be noted that the substrate 210 may include additional interconnects (e.g., traces, vias), which are not shown for the purpose of clarity. These un-shown (or not visible) interconnects may couple the capacitors 217 and/or 219 to the via 214 and/or pad 216 in some implementations. For example, the interconnect 306 and/or the via 308 may be coupled to the via 214 through one or more interconnects (e.g., trace and/or via) in the substrate 210. Similarly, in some implementations, the via 302 and/or the interconnect 304 may be coupled to the via 214 and/or the pad 216 through one or more interconnects (e.g., trace and/or via) in the substrate 210.

Figure 4:
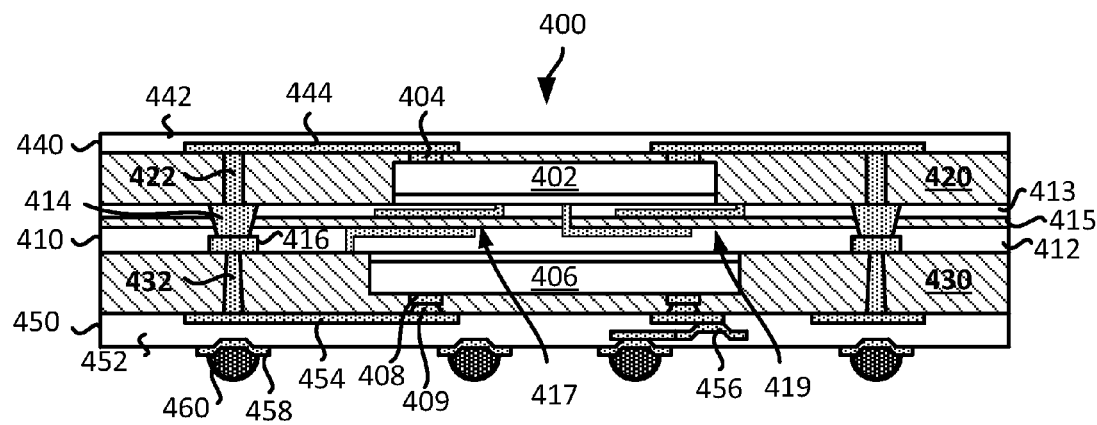
FIG. 4 illustrates an example of a package on package (PoP) integrated device that includes a hybrid substrate with a capacitor.

Exemplary Package on Package (PoP) Integrated Device that Includes a Capacitor in a Hybrid Substrate FIG. 4 illustrates an exemplary package on package (PoP) integrated device 400 that includes a capacitor in a hybrid substrate. As shown in FIG. 4, the integrated device 400 (e.g., integrated package device) includes a first die 402, a second die 406, a substrate 410, a first encapsulation layer 420, a second encapsulation layer 430, a first redistribution portion 440, and a second redistribution portion 450.

The substrate 410 includes a first dielectric layer 412, a second dielectric layer 413, a third dielectric layer 415, a via 414, a pad 416, a first capacitor 417 and a second capacitor 419. In some implementations, the substrate 410 is a hybrid laminate substrate. In some implementations, the third dielectric layer 415 has a high k value, relative to the k value of the first dielectric layer 412 and/or the second dielectric layer 413. For example, the third dielectric layer 415 may have a k value that is about at least 2 times greater than the k value of the first dielectric layer 412 and/or the second dielectric layer 413. In some implementations, the substrate 410 may include more than three dielectric layers.

The substrate 410 includes a first surface (e.g., top surface) and a second surface (e.g., bottom surface). The via 414 is coupled to the pad 416. In some implementations, the combination of the via 414 and the pad 416 traverses from the first surface of the substrate 410 to the second surface of the substrate 410. In some implementations, the via 414 and/or the pad 416 is a form of an interconnect that traverses the substrate 410.

It should be noted that the substrate 410 may include additional interconnects (e.g., traces, vias), which are not shown for the purpose of clarity. These un-shown (or not visible) interconnects may couple the capacitors 417 and/or 419 to the via 414 and/or pad 416 in some implementations. In some implementations, at least one of the capacitors 417 and/or 419 may be electrically coupled to at least the first die 402 and/or the second die 406. For example, the capacitor 417 may be electrically coupled to the first die 402 through the via 414, the interconnect 422, the interconnect 444, and/or the interconnect 404. Similarly, the capacitor 417 may be electrically coupled to the second die 406 through the via 414, the pad 416, the interconnect 432, the interconnect 454, the interconnect 408, and/or the interconnect 409.

In some implementations, the first capacitor 417 is a first plate capacitor. In some implementations, the second capacitor 419 is a second plate capacitor 419. In some implementations, a plate capacitor is defined by two interconnects separated by a gap. In some implementations, the gap is defined by one or more dielectric layers. The first and second capacitors 417 and 419 are further described in detail below in FIG. 5.

The first die 402 includes a back side and a front side (e.g., active side). The front side is coupled to a set of die interconnects 404. The set of die interconnects 404 may be one of at least pads and/or pillars in some implementations. The back side of the first die 402 is coupled to the first surface of the substrate 410. In some implementations, a bonding agent (e.g., glue) is used to couple the back side of the first die 402 to the first surface of the substrate 410. As shown in FIG. 4, the back side of the first die 402 is facing the substrate 410 while the front side (e.g., active side) of the first die 402 is facing away from the substrate 410.

The first encapsulation layer 420 encapsulates the first die 402 and the set of die interconnects 404. In some implementations, the first encapsulation layer 420 is one of at least a mold, a polymer, and/or a photo-etchable material. In some implementations, a photo-etchable material is a material that may be etched through a photo etching process. The first encapsulation layer 420 includes a set of interconnects 422. In some implementations, the set of interconnects 422 is one of at least a through encapsulation via (TEV) and/or a through mold via (TMV). In some implementations, the set of interconnects 422 traverses from a first surface (e.g., top surface) of the first encapsulation layer 420 to a second surface (e.g., bottom surface) of the first encapsulation layer 420. FIG. 4 illustrates that a portion of the set of interconnects 422 in the first encapsulation layer 420 is coupled to the via 414 in the substrate 410.

The first redistribution portion 440 is coupled to the first surface of the first encapsulation layer 420. The first redistribution portion 440 includes a fourth dielectric layer 442 and a first set of redistribution interconnects 444. In some implementations, the first redistribution portion 440 may include more than one set of redistribution interconnects. The first set of redistribution interconnects 444 is coupled to the set of die interconnects 404 and the set of interconnects 422. In some implementations, the fourth dielectric layer 442 includes one or more dielectric layers.

The second die 406 includes a back side and a front side (e.g., active side). The front side is coupled to a set of interconnects 408. The set of interconnects 408 may be one of at least pads and/or pillars in some implementations. The back side of the second die 406 is coupled to the second surface of the substrate 410. In some implementations, a bonding agent (e.g., glue) is used to couple the back side of the second die 406 to the second surface of the substrate 410. As shown in FIG. 4, the back side of the second die 406 is facing the substrate 410 while the front side (e.g., active side) of the second die 406 is facing away from the substrate 410.

The second encapsulation layer 430 encapsulates the second die 406 and the set of interconnects 408. In some implementations, the second encapsulation layer 430 is one of at least a mold, a polymer, and/or a photo-etchable material. In some implementations, a photo-etchable material is a material that may be etched through a photo etching process. The second encapsulation layer 430 includes a set of interconnects 432 and a set of interconnects 409. In some implementations, the set of interconnects 432 is one of at least a through encapsulation via (TEV) and/or a through mold via (TMV). In some implementations, the set of interconnects 432 traverses from a first surface (e.g., top surface) of the second encapsulation layer 430 to a second surface (e.g., bottom surface) of the second encapsulation layer 430. FIG. 4 illustrates that a portion of the set of interconnects 432 in the second encapsulation layer 430 is coupled to the pad 416 in the substrate 410. In some implementations, the set of interconnects 409 is one of at least a through encapsulation via (TEV) and/or a through mold via (TMV). The set of interconnects 409 is coupled to the set of interconnects 408.

The second redistribution portion 450 is coupled to the first surface of the second encapsulation layer 430. The second redistribution portion 450 includes a fifth dielectric layer 452, a second set of redistribution interconnects 454, a third set of redistribution interconnects 456, and a set of under bump metallization (UBM) layers 458. In some implementations, the second redistribution portion 450 may include one, two, or more than two sets of redistribution interconnects. The first set of redistribution interconnects 454 is coupled to the set of interconnects 409 and the set of interconnects 432. In some implementations, the fifth dielectric layer 452 includes one or more dielectric layers.

A set of solder balls 460 is coupled to the set of UBM layers 458. In some implementations, the UBM layers 458 is optional. In such instances, the set of solder balls 460 may be directly coupled to one of the redistribution interconnects.

Figure 5:
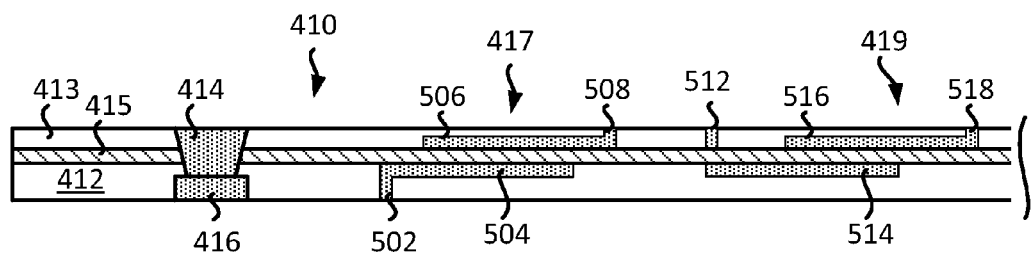
FIG. 5 illustrates a close up view of an example of a hybrid substrate with a capacitor.

FIG. 5 illustrates a close-up view of a portion of the substrate 410 of FIG. 4. As shown in FIG. 5, the substrate 410 includes the first dielectric layer 412, the second dielectric layer 413, the third dielectric layer 415, the via 414, the pad 416, the first capacitor 417 and the second capacitor 419. In some implementations, the substrate 410 is a laminate substrate. The substrate 410 includes a first surface (e.g., top surface) and a second surface (e.g., bottom surface). The via 414 is coupled to the pad 416. In some implementations, the combination of the via 414 and the pad 416 traverses from the first surface of the substrate 410 to the second surface of the substrate 410. In some implementations, the via 414 and/or the pad 416 is a form of an interconnect that traverses the substrate 410.

In some implementations, the first capacitor 417 is a first plate capacitor. As shown in FIG. 5, the first capacitor 417 includes a first via 502, a first interconnect 504, a second interconnect 506, and a second via 508. In some implementations, the first via 502 is a first terminal of the first capacitor 417. In some implementations, the first interconnect 504 is a first plate of the first capacitor 417. In some implementations, the second interconnect 506 is a second plate of the first capacitor 417. In some implementations, the second via 508 is a second terminal of the first capacitor 417. In some implementations, the first interconnect 504 and the second interconnect 506 are at least substantially parallel to each other. As shown in FIG. 5, the first interconnect 504 and the second interconnect 506 are separated by a gap and/or spacing. The gap and/or spacing is filled with a layer of the third dielectric layer 415. In some implementations, the use of the third dielectric layer 415 increases the capacitance of the first capacitor 417. In some implementations, each of the first and second vias 502 and 508 may include one or more vias, or a combination of interconnects, vias, and/or pads.

In some implementations, the second capacitor 419 is a second plate capacitor. As shown in FIG. 5, the second capacitor 419 includes a third via 512, a third interconnect 514, a fourth interconnect 516, and a fourth via 518. In some implementations, the third via 512 is a first terminal of the second capacitor 419. In some implementations, the third interconnect 514 is a first plate of the second capacitor 419. In some implementations, the fourth interconnect 516 is a second plate of the second capacitor 419. In some implementations, the fourth via 518 is a second terminal of the second capacitor 419. In some implementations, the third interconnect 514 and the fourth interconnect 516 are at least substantially parallel to each other. As shown in FIG. 5, the third interconnect 514 and the fourth interconnect 516 are separated by a gap and/or spacing. The gap and/or spacing is filled with a layer of the third dielectric layer 415. In some implementations, the use of the third dielectric layer 415 increases the capacitance of the second capacitor 419. In some implementations, each of the third and fourth vias 512 and 518 may include one or more vias, or a combination of interconnects, vias, and/or pads.

In some implementations, the second capacitor 419 is a second plate capacitor 419. In some implementations, a plate capacitor is defined by two interconnects separated by a gap. In some implementations, the gap is defined by the third dielectric layer 415.

It should be noted that the substrate 410 may include additional interconnects (e.g., traces, vias), which are not shown for the purpose of clarity. These un-shown (or not visible) interconnects may couple the capacitors 417 and/or 419 to the via 414 and/or pad 416 in some implementations. For example, the interconnect 506 and/or the via 508 may be coupled to the via 414 through one or more interconnects (e.g., trace and/or via) in the substrate 410. Similarly, in some implementations, the via 502 and/or the interconnect 504 may be coupled to the via 414 and/or the pad 416 through one or more interconnects (e.g., trace and/or via) in the substrate 410.

Figure 6:
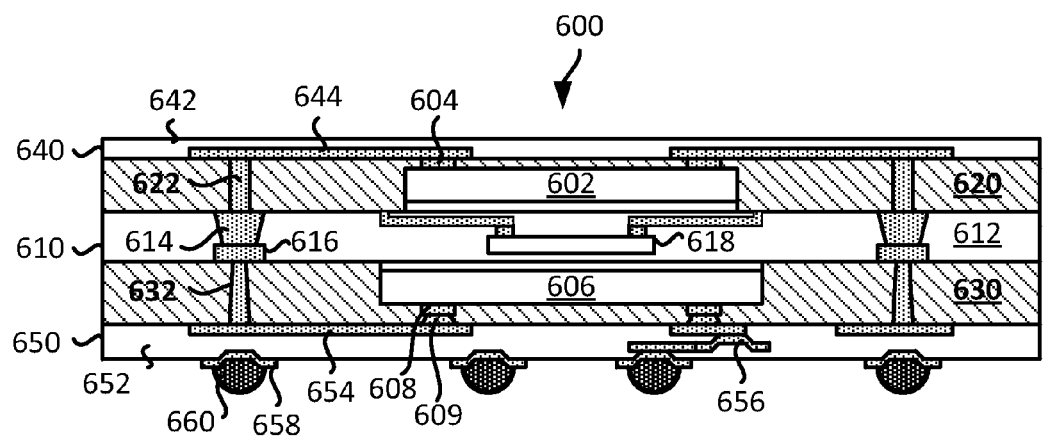
FIG. 6 illustrates an example of a package on package (PoP) integrated device that includes a substrate with an embedded package substrate (EPS) capacitor.

Exemplary Package on Package (PoP) Integrated Device that Includes an Embedded Package Substrate (EPS) Capacitor in a Substrate FIG. 6 illustrates an exemplary package on package (PoP) integrated device 600 that includes a capacitor in a substrate. As shown in FIG. 6, the integrated device 600 (e.g., integrated package device) includes a first die 602, a second die 606, a substrate 610, a first encapsulation layer 620, a second encapsulation layer 630, a first redistribution portion 640, and a second redistribution portion 650.

The substrate 610 includes a dielectric layer 612, a via 614, a pad 616, a capacitor 618. In some implementations, the substrate 610 is a laminate substrate. The substrate 610 includes a first surface (e.g., top surface) and a second surface (e.g., bottom surface). In some implementations, the dielectric layer 612 may include several dielectric layers. In some implementations, the dielectric layers may be the same material. The via 614 is coupled to the pad 616. In some implementations, the combination of the via 614 and the pad 616 traverse from the first surface of the substrate 610 to the second surface of the substrate 610. In some implementations, the via 614 and/or the pad 616 is a form of an interconnect that traverse the substrate 610.

In some implementations, the capacitor 618 is an embedded package substrate (EPS) capacitor. The capacitor 618 is further described in detail below in FIG. 7.

The first die 602 includes a back side and a front side (e.g., active side). The front side is coupled to a set of die interconnects 604. The set of die interconnects 604 may be one of at least pads and/or pillars in some implementations. The back side of the first die 602 is coupled to the first surface of the substrate 610. In some implementations, a bonding agent (e.g., glue) is used to couple the back side of the first die 602 to the first surface of the substrate 610. As shown in FIG. 6, the back side of the first die 602 is facing the substrate 610 while the front side (e.g., active side) of the first die 602 is facing away from the substrate 610.

The first encapsulation layer 620 encapsulates the first die 602 and the set of die interconnects 604. In some implementations, the first encapsulation layer 620 is one of at least a mold, a polymer, and/or a photo-etchable material. In some implementations, a photo-etchable material is a material that may be etched through a photo etching process. The first encapsulation layer 620 includes a set of interconnects 622. In some implementations, the set of interconnects 622 is one of at at least a through encapsulation via (TEV) and/or a through mold via (TMV). In some implementations, the set of interconnects 622 traverses from a first surface (e.g., top surface) of the first encapsulation layer 620 to a second surface (e.g., bottom surface) of the first encapsulation layer 620. FIG. 6 illustrates that a portion of the set of interconnects 622 in the first encapsulation layer 620 is coupled to the via 614 in the substrate 610.

The first redistribution portion 640 is coupled to the first surface of the first encapsulation layer 620. The first redistribution portion 640 includes a second dielectric layer 642 and a first set of redistribution interconnects 644. In some implementations, the first redistribution portion 640 may include more than one set of redistribution interconnects. The first set of redistribution interconnects 644 is coupled to the set of die interconnects 604 and the set of interconnects 622. In some implementations, the second dielectric layer 642 includes one or more dielectric layers.

The second die 606 includes a back side and a front side (e.g., active side). The front side is coupled to a set of interconnects 608. The set of interconnects 608 may be one of at least pads and/or pillars in some implementations. The back side of the second die 606 is coupled to the second surface of the substrate 610. In some implementations, a bonding agent (e.g., glue) is used to couple the back side of the second die 606 to the second surface of the substrate 610. As shown in FIG. 6, the back side of the second die 606 is facing the substrate 610 while the front side (e.g., active side) of the second die 606 is facing away from the substrate 610.

The second encapsulation layer 630 encapsulates the second die 606 and the set of interconnects 608. In some implementations, the second encapsulation layer 630 is one of at least a mold, a polymer, and/or a photo-etchable material. In some implementations, a photo-etchable material is a material that may be etched through a photo etching process. The second encapsulation layer 630 includes a set of interconnects 632 and a set of interconnects 609. In some implementations, the set of interconnects 632 is one of at least a through encapsulation via (TEV) and/or a through mold via (TMV). In some implementations, the set of interconnects 632 traverses from a first surface (e.g., top surface) of the second encapsulation layer 630 to a second surface (e.g., bottom surface) of the second encapsulation layer 630. FIG. 6 illustrates that a portion of the set of interconnects 632 in the second encapsulation layer 630 is coupled to the pad 616 in the substrate 610. In some implementations, the set of interconnects 609 is one of at least a through encapsulation via (TEV) and/or a through mold via (TMV). The set of interconnects 609 is coupled to the set of interconnects 608.

The second redistribution portion 650 is coupled to the first surface of the second encapsulation layer 630. The second redistribution portion 650 includes a third dielectric layer 652, a second set of redistribution interconnects 654, a third set of redistribution interconnects 656, and a set of under bump metallization (UBM) layers 658. In some implementations, the second redistribution portion 650 may include one, two, or more than two sets of redistribution interconnects. The first set of redistribution interconnects 654 is coupled to the set of interconnects 609 and the set of interconnects 632. In some implementations, the third dielectric layer 652 includes one or more dielectric layers.

It should be noted that the substrate 610 may include additional interconnects (e.g., traces, vias), which are not shown for the purpose of clarity. These un-shown (or not visible) interconnects may couple the capacitor 618 to the via 614 and/or pad 616 in some implementations. In some implementations, the capacitor 618 may be electrically coupled to at least the first die 602 and/or the second die 606. For example, the capacitor 618 may be electrically coupled to the first die 602 through the via 614, the interconnect 622, the interconnect 644, and/or the interconnect 604. Similarly, the capacitor 618 may be electrically coupled to the second die 606 through the via 614, the pad 616, the interconnect 632, the interconnect 654, the interconnect 608, and/or the interconnect 609.

A set of solder balls 660 is coupled to the set of UBM layers 658. In some implementations, the UBM layers 658 are optional. In such instances, the set of solder balls 660 may be directly coupled to one of the redistribution interconnects.

Figure 7:
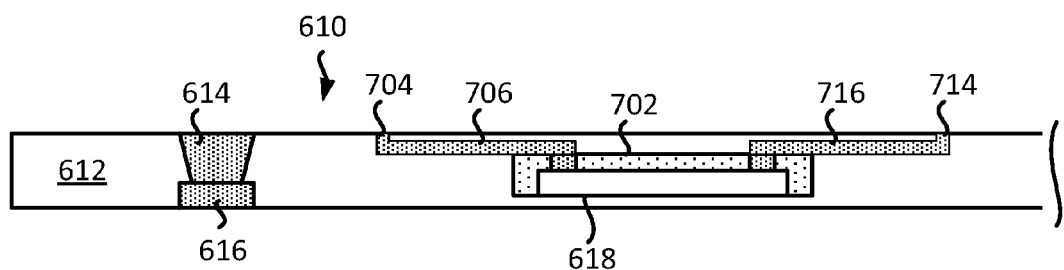
FIG. 7 illustrates a close up view of an example of a substrate with an embedded package substrate (EPS) capacitor.

FIG. 7 illustrates a close-up view of a portion of the substrate 610 of FIG. 6. As shown in FIG. 7, the substrate 610 includes the dielectric layer 612, the via 614, the pad 616, the capacitor 618, a dielectric layer 702, a first via 704, a first interconnect 706, a second via 714, and a second interconnect 716. In some implementations, the substrate 610 is a laminate substrate. The substrate 610 includes a first surface (e.g., top surface) and a second surface (e.g., bottom surface). In some implementations, the dielectric layer 612 may include several dielectric layers. The via 614 is coupled to the pad 616. In some implementations, the combination of the via 614 and the pad 616 traverses from the first surface of the substrate 610 to the second surface of the substrate 610. In some implementations, the via 614 and/or the pad 616 is a form of an interconnect that traverses the substrate 610.

In some implementations, the capacitor 618 is an embedded package substrate (EPS) capacitor. As shown in FIG. 7, the capacitor 618 is at least partially surrounded by the dielectric layers 612 and 702. The capacitor 618 includes a set of interconnects (e.g., pads, pillar), which are coupled to the first and second interconnects 706 and 716.

It should be noted that the substrate 610 may include additional interconnects (e.g., traces, vias), which are not shown for the purpose of clarity. These un-shown (or not visible) interconnects may couple the capacitor 618 to the via 614 and/or pad 616 in some implementations. For example, the via 704 and/or the interconnect 706 may be coupled to the via 614 through one or more interconnects (e.g., trace and/or via) in the substrate 610. Similarly, in some implementations, the via 714 and/or the interconnect 716 may be coupled to the via 614 and/or the pad 616 through one or more interconnects (e.g., trace and/or via) in the substrate 610.

Figure 8A:
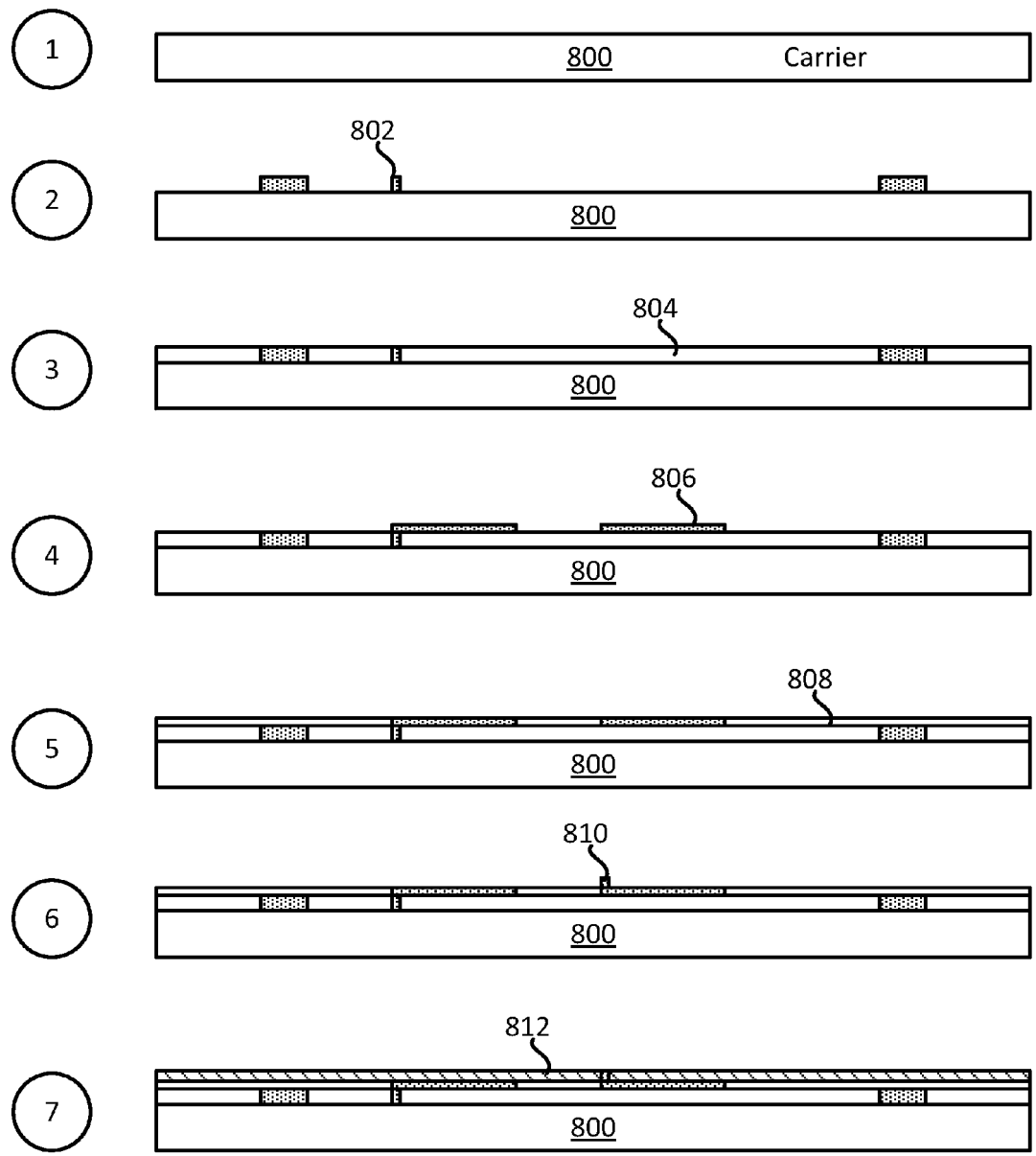
FIG. 8 (comprising FIG. 8A and FIG. 8B) illustrates an example of a sequence for fabricating a substrate with a capacitor.
Figure 8B:
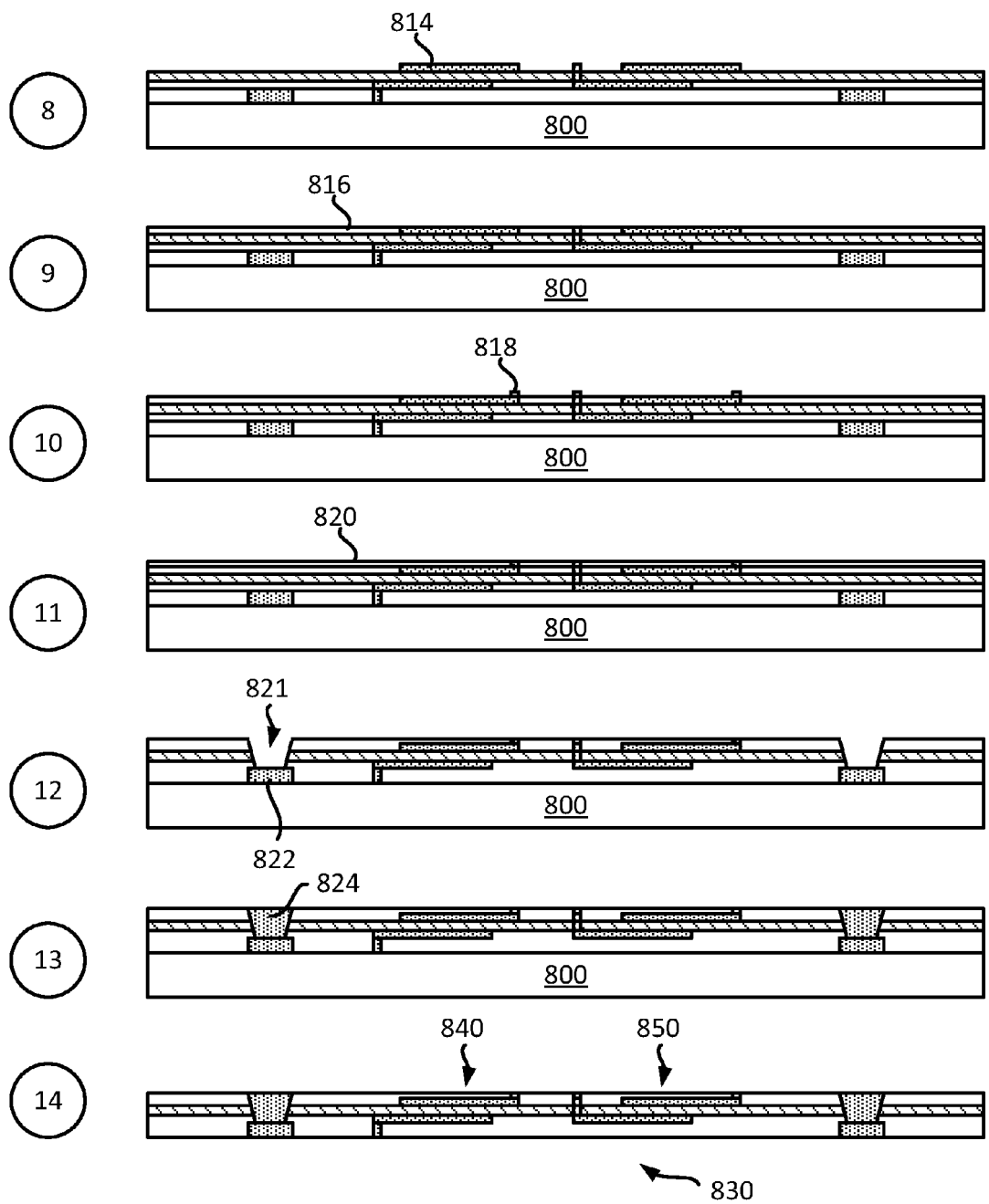

Exemplary Sequence for Providing/Fabricating a Substrate that Includes a Capacitor In some implementations, providing/fabricating a substrate with a capacitor includes several processes. FIG. 8 (which includes FIGS. 8A-8B) illustrates an exemplary sequence for providing/fabricating a substrate that includes a capacitor. In some implementations, the sequence of FIGS. 8A-8B may be used to provide/fabricate the substrate of FIGS. 2, 3, 4, 5, and/or other substrates in the present disclosure. However, for the purpose of simplification, FIGS. 8A-8B will be described in the context of providing/fabricating the substrate of FIG. 4 or FIG. 5.

It should be noted that the sequence of FIGS. 8A-8B may combine one or more stages in order to simplify and/or clarify the sequence for providing a substrate. In some implementations, the order of the processes may be changed or modified.

Stage 1 of FIG. 8A, illustrates a state after a carrier 800 is provided. In some implementations, the carrier 800 is provided by a supplier. In some implementations, the carrier 800 is fabricated (e.g., formed). In some implementations, the carrier 800 may be a substrate and/or a wafer.

Stage 2 illustrates a state after a first metal layer 802 is provided (e.g., formed) on the carrier 800. Specifically, stage 2 illustrates a state after the first metal layer 802 is formed over a first surface of the carrier 800. In some implementations, providing the first metal layer 802 may include forming the first metal layer 802 and selectively etching portions of the first metal layer 802 to define one or more interconnects (e.g., form one or more pads, vias, traces). In some implementations, the first metal layer 802 is plated on the carrier 800 using a plating process. Examples of plating processes are described in FIGS. 12-17.

Stage 3 illustrates a state after a first dielectric layer 804 is provided on the carrier 800.

Stage 4 illustrates a state after a second metal layer 806 is provided (e.g., formed) on the first dielectric layer 804. Specifically, stage 4 illustrates a state after the second metal layer 806 is formed over a first surface of the first dielectric layer 804. In some implementations, providing the second metal layer 806 may include forming the second metal layer 806 and selectively etching portions of the second metal layer 806 to define one or more interconnects (e.g., form one or more pads, vias, traces). In some implementations, the second metal layer 806 is plated on the first dielectric layer 804 using a plating process. In some implementations, some portions of the second metal layer 806 may be coupled to some portions of the first metal layer 802.

Stage 5 illustrates a state after a second dielectric layer 808 is provided on the first dielectric layer 804.

Stage 6 illustrates a state after a third metal layer 810 is provided (e.g., formed) on the second dielectric layer 808. Specifically, stage 6 illustrates a state after the third metal layer 810 is formed over a first surface of the second dielectric layer 808. In some implementations, providing the third metal layer 810 may include forming the third metal layer 810 and selectively etching portions of the third metal layer 810 to define one or more interconnects (e.g., form one or more pads, vias, traces). In some implementations, the third metal layer 810 is plated on the second dielectric layer 808 using a plating process. In some implementations, some portions of the third metal layer 810 may be coupled to some portions of the second metal layer 806.

Stage 7 illustrates a state after a third dielectric layer 812 is provided on the second dielectric layer 808. In some implementations, the third dielectric layer 812 is made of a different material than the second dielectric layer 808. In some implementations, the third dielectric layer 812 has a k value that is substantially higher than the k value of the second dielectric layer 808. It should be noted that in some implementations, the third dielectric layer 812 may be the same material as the second dielectric layer 808.

Stage 8 of FIG. 8B, illustrates a state after a fourth metal layer 814 is provided (e.g., formed) on the third dielectric layer 808. Specifically, stage 8 illustrates a state after the fourth metal layer 814 is formed over a first surface of the third dielectric layer 812. In some implementations, providing the fourth metal layer 814 may include forming the fourth metal layer 814 and selectively etching portions of the fourth metal layer 814 to define one or more interconnects (e.g., form one or more pads, vias, traces). In some implementations, the fourth metal layer 814 is plated on the third dielectric layer 812 using a plating process. In some implementations, some portions of the fourth metal layer 814 may be coupled to some portions of the third metal layer 810.

Stage 9 illustrates a state after a fourth dielectric layer 816 is provided on the third dielectric layer 812.

Stage 10 illustrates a state after a fifth metal layer 818 is provided (e.g., formed) on the fourth dielectric layer 816. Specifically, stage 10 illustrates a state after the fifth metal layer 818 is formed over a first surface of the fourth dielectric layer 816. In some implementations, providing the fifth metal layer 818 may include forming the fifth metal layer 818 and selectively etching portions of the fifth metal layer 818 to define one or more interconnects (e.g., form one or more pads, vias, traces). In some implementations, the fifth metal layer 818 is plated on the fourth dielectric layer 816 using a plating process. In some implementations, some portions of the fifth metal layer 818 may be coupled to some portions of the fourth metal layer 814.

Stage 11 illustrates a state after a fifth dielectric layer 820 is provided on the fourth dielectric layer 816.

Stage 12 illustrates a state after at least one cavity 821 is formed in at least one of the dielectric layers. As shown at stage 12, the cavity 821 is formed over a pad 822 (which is part of the first metal layer 802). The cavity traverses, the first, second, third, fourth and fifth dielectric layers 804, 808, 812, 816, and 820. In some implementations, the cavity 821 is formed using a laser etching process (e.g., laser ablation).

Stage 13 illustrates a state after the cavity 821 is filled with a metal material to define an interconnect 824. In some implementations, the interconnect 824 is a via that is coupled to the pad 822. Different implementations may use different processes to fill the cavity 821. In some implementations, a plating process is used. In some implementations, the cavity 821 is filled with a conducting paste.

Stage 14 illustrates a state after the carrier 800 is removed (e.g., etched away), leaving behind the substrate 830 that includes a first capacitor 840 and a second capacitor 850.

Figure 9A:
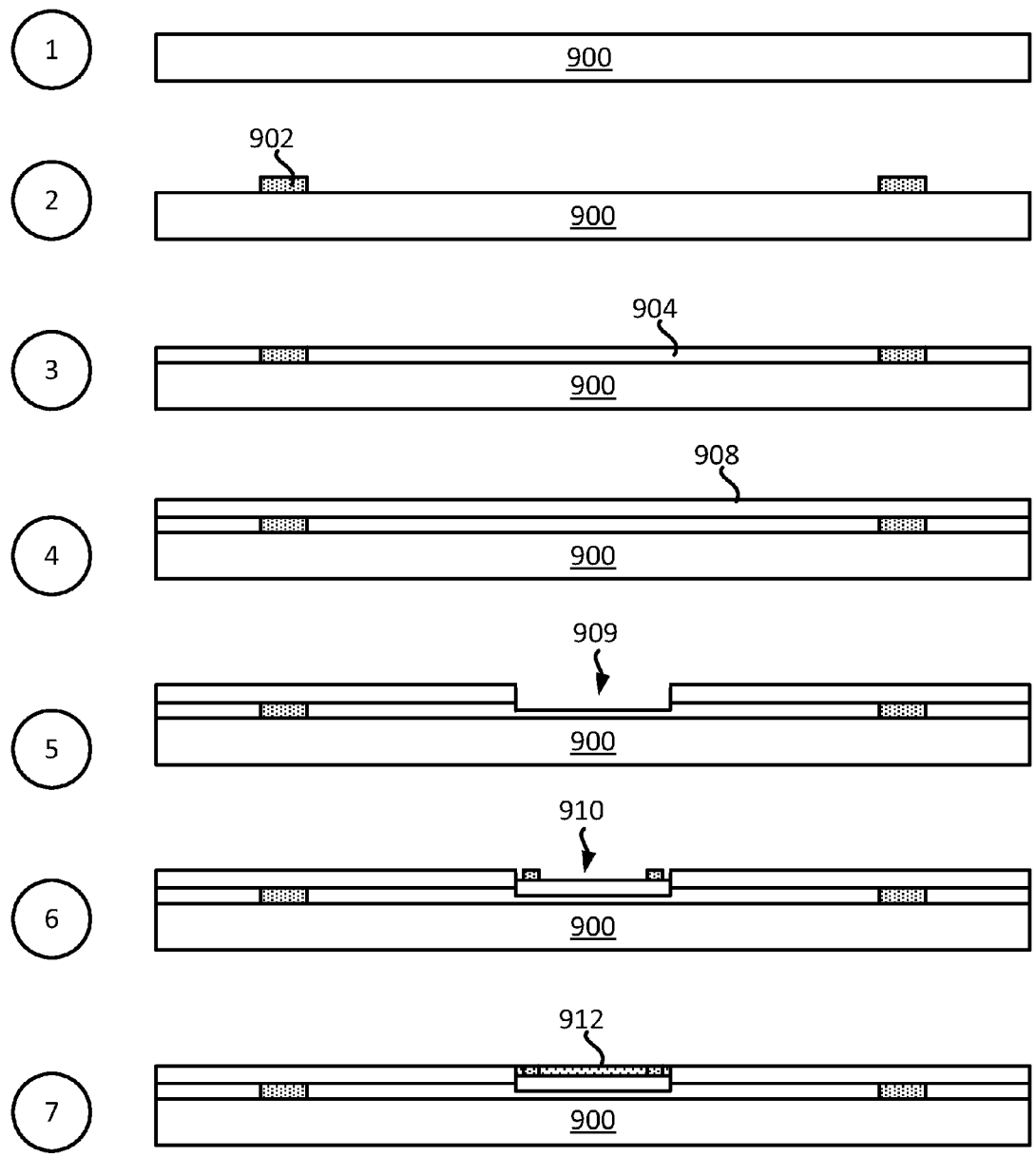
FIG. 9 (comprising FIG. 9A and FIG. 9B) illustrates an example of a sequence for fabricating a substrate with an embedded package substrate (EPS) capacitor.
Figure 9B:
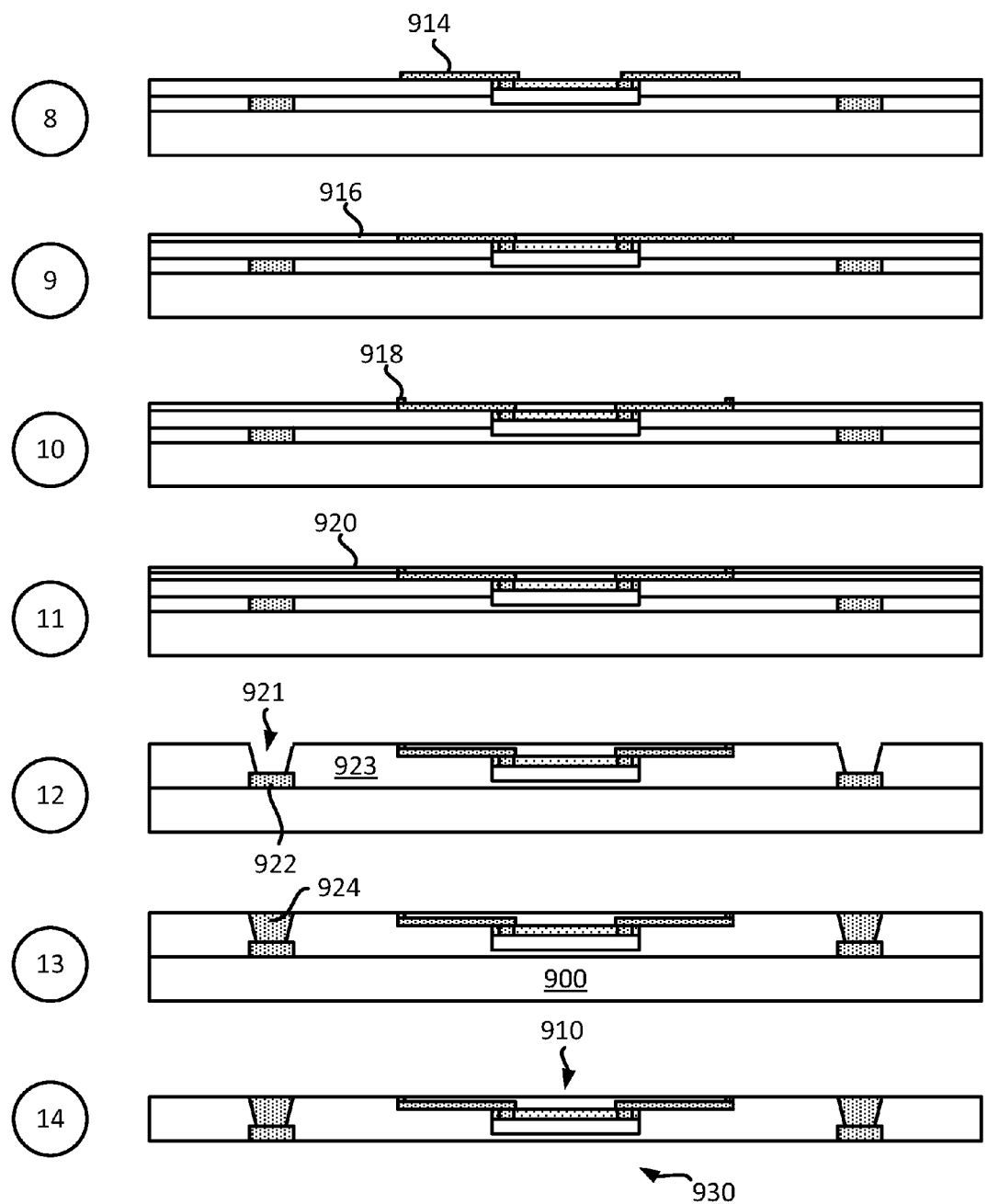

Exemplary Sequence for Providing/Fabricating a Substrate that Includes an Embedded Package Substrate (EPS) Capacitor In some implementations, providing/fabricating a substrate with an embedded package substrate (EPS) capacitor includes several processes. FIG. 9 (which includes FIGS. 9A-9B) illustrates an exemplary sequence for providing/fabricating a substrate that includes an EPS capacitor. In some implementations, the sequence of FIGS. 9A-9B may be used to provide/fabricate the substrate of FIGS. 6, 7, and/or other substrates in the present disclosure. However, for the purpose of simplification, FIGS. 9A-9B will be described in the context of providing/fabricating the substrate of FIG. 6 or FIG. 7.

It should be noted that the sequence of FIGS. 9A-9B may combine one or more stages in order to simplify and/or clarify the sequence for providing a substrate. In some implementations, the order of the processes may be changed or modified.

Stage 1 of FIG. 9A, illustrates a state after a carrier 900 is provided. In some implementations, the carrier 900 is provided by a supplier. In some implementations, the carrier 900 is fabricated (e.g., formed). In some implementations, the carrier 900 may be a substrate and/or a wafer.

Stage 2 illustrates a state after a first metal layer 902 is provided (e.g., formed) on the carrier 900. Specifically, stage 2 illustrates a state after the first metal layer 902 is formed over a first surface of the carrier 900. In some implementations, providing the first metal layer 902 may include forming the first metal layer 902 and selectively etching portions of the first metal layer 902 to define one or more interconnects (e.g., form one or more pads, vias, traces). In some implementations, the first metal layer 902 is plated on the carrier 900 using a plating process. Examples of a plating process are described in FIGS. 12-17.

Stage 3 illustrates a state after a first dielectric layer 904 is provided on the carrier 900.

Stage 4 illustrates a state after a second dielectric layer 908 is provided on the first dielectric layer 904.

Stage 5 illustrates a state after a cavity 909 is formed in at least one of the dielectric layers. As shown in stage 5, the cavity 909 is formed in the second dielectric layer 908 and at least part of the first dielectric layer 904.

Stage 6 illustrates a state after en embedded package substrate (EPS) capacitor 910 is provided in the cavity 909. The EPS capacitor 910 includes terminals (e.g., pads). The terminals of the EPS capacitor 910 face away from the carrier 900.

Stage 7 illustrates a state after a third dielectric layer 912 is provided on the EPS capacitor 910 in the cavity 909. In some implementations, the third dielectric layer 912 is made of a same or different material than the second dielectric layer 908 and/or the first dielectric layer 904.

Stage 8 of FIG. 9B, illustrates a state after a second metal layer 914 is provided (e.g., formed) on the third dielectric layer 912. Specifically, stage 8 illustrates a state after the second metal layer 914 is formed over a first surface of the third dielectric layer 912 and/or the second dielectric layer 908. In some implementations, providing the second metal layer 914 may include forming the second metal layer 914 and selectively etching portions of the second metal layer 914 to define one or more interconnects (e.g., form one or more pads, vias, traces). In some implementations, the second metal layer 914 is plated on the third dielectric layer 912 and/or the second dielectric layer 908 using a plating process. In some implementations, some portions of the second metal layer 914 may be coupled to some portions of the terminals of the EPS capacitor 910.

Stage 9 illustrates a state after a fourth dielectric layer 916 is provided on the third dielectric layer 912 and the second dielectric layer 908.

Stage 10 illustrates a state after a third metal layer 918 is provided (e.g., formed) on the fourth dielectric layer 916. Specifically, stage 10 illustrates a state after the third metal layer 918 is formed over a first surface of the fourth dielectric layer 916. In some implementations, providing the third metal layer 918 may include forming the third metal layer 918 and selectively etching portions of the third metal layer 918 to define one or more interconnects (e.g., form one or more pads, vias, traces). In some implementations, the third metal layer 918 is plated on the fourth dielectric layer 916 using a plating process. In some implementations, some portions of the third metal layer 918 may be coupled to some portions of the second metal layer 914.

Stage 11 illustrates a state after a fifth dielectric layer 920 is provided on the fourth dielectric layer 916.

Stage 12 illustrates a state after at least one cavity 921 is formed in at least one of the dielectric layers. As shown at stage 12, the cavity 921 is formed over a pad 922 (which is part of the first metal layer 902). The cavity traverses, the first, second, fourth, and fifth dielectric layers 904, 908, 916, and 920. In some implementations, the dielectric layer 923 may represent the first, second, fourth, and fifth dielectric layers 904, 908, 916, and 920. In some implementations, the cavity 921 is formed using a laser etching process (e.g., laser ablation).

Stage 13 illustrates a state after the cavity 921 is filled with a metal material to define an interconnect 924. In some implementations, the interconnect 924 is a via that is coupled to the pad 922. Different implementations may use different processes to fill the cavity 921. In some implementations, a plating process is used. In some implementations, the cavity 921 is filled with a conducting paste.

Stage 14 illustrates a state after the carrier 900 is removed (e.g., etched away), leaving behind the substrate 930 that includes the EPS capacitor 910.

Exemplary Sequence for Providing/Fabricating a Package-on Package (PoP) Integrated Device Comprising a Substrate that Includes a Capacitor In some implementations, providing/fabricating a package-on-package (PoP) integrated device that includes a substrate with a capacitor includes several processes. FIG. 10 (which includes FIGS. 10A-10C) illustrates an exemplary sequence for providing/fabricating a PoP integrated device that includes a substrate with a capacitor. In some implementations, the sequence of FIGS. 10A-10C may be used to provide/fabricate the integrated device of FIGS. 2, 4, 6, and/or other integrated devices in the present disclosure. However, for the purpose of simplification, FIGS. 10A-10C will be described in the context of providing/fabricating the integrated device of FIG. 4.

It should be noted that the sequence of FIGS. 10A-10C may combine one or more stages in order to simplify and/or clarify the sequence for providing an integrated device. In some implementations, the order of the processes may be changed or modified.

Stage 1 of FIG. 10A, illustrates a state after a substrate 1000 that includes a capacitor is provided. In some implementations, the substrate 1000 is similar to the substrate 210 of FIG. 2, the substrate 410 of FIG. 4, or the substrate 610 of FIG. 6, described above. In some implementations, the substrate 1000 is provided by a supplier. In some implementations, the substrate 1000 is fabricated (e.g., formed). The substrate 1000 includes a via 1001 and a pad 1003. The via 1001 is coupled to the pad 1003.

Stage 2 illustrates a state after an interconnect 1005 is provided (e.g., formed) on the substrate 1000. Specifically, the interconnect 1005 is provided over the via 1001. In some implementations, the interconnect 1005 is a via (e.g., through encapsulation via, through mold via). The interconnect 1005 may be formed on the substrate through one or more plating processes.

Stage 3 illustrates a state after a first die 1002 is provided and coupled to a first surface (e.g., top surface) of the substrate 1000. The first die 1002 may include a back side and a front side (e.g., active side). In some implementations, the back side of the first die 1002 is coupled to the first surface of the substrate 1000 using a bonding agent (e.g., glue).

Stage 4 illustrates a state after a first encapsulation layer 1004 is provided (e.g., formed) on the first surface of the substrate 1000. The first encapsulation layer 1004 covers the first die 1002 and at least some of the interconnect 1005.

Stage 5 illustrates a state after a first redistribution interconnect 1006 is provided (e.g., formed) on the first encapsulation layer 1004. In some implementations, the first redistribution interconnect 1006 is formed by forming one or more metal layers and selectively etching portions of the one or more metal layers. The first redistribution interconnect 1006 is coupled to the via 1001 and the first die 1002.

Stage 6 illustrates a state after a first dielectric layer 1008 is provided (e.g., formed) on the first encapsulation layer 1004 and the first redistribution interconnect 1006.

Stage 7 of FIG. 10B, illustrates a state after a second die 1012 is provided and coupled to a second surface (e.g., bottom surface) of the substrate 1000. The second die 1012 may include a back side and a front side (e.g., active side). In some implementations, the back side of the second die 1012 is coupled to the second surface of the substrate 1002 using a bonding agent (e.g., glue). In some implementations, the substrate 1002 may be flipped upside down before the second die 1012 is coupled to the second surface of the substrate 1000.

Stage 8 illustrates a state after a second encapsulation layer 1014 is provided (e.g., formed) on the second surface of the substrate 1000. The second encapsulation layer 1014 covers the second die 1012. In some implementations, the second encapsulation layer 1014 is photo-etchable material.

Stage 9 illustrates a state after a first cavity 1015 and a second cavity 1017 are formed in the second encapsulation layer 1014. Different implementations may use different processes for forming the cavities. In some implementations, a laser etching process (e.g., laser ablation) is used to form the cavities. In some implementations, a photo-etching process is used to form the cavities. As shown at stage 9, the cavity 1015 is formed on the pad 1003, and the cavity 1017 is formed on an interconnect (e.g., pad, pillar) of the second die 1012.

Stage 10 illustrates a state after the first cavity 1015 and the second cavity 1017 are filled with an electrically conductive material to form an interconnect 1016, and an interconnect 1018, respectively. In some implementations, the interconnect 1016 is a via (e.g., through encapsulation via, through mold via). In some implementations, the interconnect 1018 is a via (e.g., through encapsulation via, through mold via).

Stage 11 illustrates a state after a second redistribution interconnect 1020 is provided (e.g., formed) on the second encapsulation layer 1014. In some implementations, the second redistribution interconnect 1020 is formed by forming one or more metal layers and selectively etching portions of the one or more metal layers. The second redistribution interconnect 1020 may be coupled to the interconnect 1005 and the second die 1012.

Stage 12 of FIG. 10C, illustrates a state after a second dielectric layer 1022 is provided (e.g., formed) on the second encapsulation layer 1014 and the second redistribution interconnect 1020.

Stage 13 illustrates a state after a third redistribution interconnect 1024 is provided (e.g., formed) on the second dielectric layer 1022. In some implementations, the third redistribution interconnect 1024 is formed by forming one or more metal layers and selectively etching portions of the one or more metal layers. The third redistribution interconnect 1024 may be coupled to at least some of the second redistribution interconnect 1020. In some implementations, portions of the second dielectric layer 1022 may be selectively etched before providing (e.g., forming) the third redistribution interconnect 1024.

Stage 14 illustrates a state after a third dielectric layer 1026 is provided (e.g., formed) on the second dielectric layer 1022 and the third redistribution interconnect 1024. State 14 also illustrates a state after an under bump metallization (UBM) layer 1028 is provided on the third dielectric layer 1026. In some implementations, the UBM layer 1028 is formed by forming one or more metal layers and selectively etching portions of the one or more metal layers. The UBM layer 1028 may be coupled to at least some of the third redistribution interconnect 1024. In some implementations, portions of the third dielectric layer 1026 may be selectively etched before providing (e.g., forming) the UBM layer 1028.

Stage 15 illustrates a state after a set of solder balls 1030 are coupled to the UBM layer 1028. In some implementations, the UBM layer 1028 may be optional. In which case, the set of solder balls 1030 may be directly coupled to the third redistribution interconnect 1024.

FIGS. 10A-10C illustrates an example of providing/fabricating an integrated device (e.g., integrated package device) that includes a capacitor. In some implementations, the integrated may be fabricated in a different manner. For example, in some implementations, stages 2-6 may be repeated on the other side of the substrate 1000 to fabricate the integrated device instead of using stages 7-12 shown in FIGS. 10A-10C. That is, stages 2-6 illustrate how a first die, a first encapsulation layer, and a first redistribution portion are provided and/or formed on a first side (e.g., top side) of the substrate. In some implementations, stages 2-6 may be repeated to provide and/or form a second die, a second encapsulation layer, and a second redistribution portion on a second side (e.g., bottom side) of the substrate. In some implementations, stages 13-15 may remain the same even when stages 2-6 are repeated.

Exemplary Flow Diagram of a Method for Providing/Fabricating a Package-on Package (PoP) Integrated Device Comprising a Substrate that Includes a Capacitor In some implementations, providing/fabricating a package-on-package (PoP) integrated device that includes a substrate with a capacitor includes several processes. FIG. 11 illustrates an exemplary flow diagram for a method for providing/fabricating a PoP integrated device that includes a substrate with a capacitor. In some implementations, the method of FIG. 11 may be used to provide/fabricate the integrated device of FIGS. 2, 4, 6, and/or other integrated devices in the present disclosure. It should be noted that the method of FIG. 11 may combine one or more steps in order to simplify and/or clarify the sequence for providing an integrated device. In some implementations, the order of the processes may be changed or modified.

The method provides (at 1105) a substrate that includes a capacitor. In some implementations, the capacitor is embedded in the substrate. In some implementations, the capacitor is one of at least a plate capacitor and/or an embedded package substrate (EPS) capacitor. FIGS. 3, 5, and 7 illustrate examples of substrates that include capacitors. In some implementations, the substrate is a laminate substrate and/or hybrid substrate. In some implementations, a hybrid substrate may include at least two different dielectric layers of different materials, one of which has k value that is substantially higher than the k value of the other dielectric layer. The substrate may includes interconnects, such as traces, pads and/or vias. FIGS. 8-9, and stage 1 of FIG. 10A illustrate examples of providing a substrate that includes a capacitor.

The method couples (at 1110) a first die to a first surface of the substrate. In some implementations, the first die has a back side and front side (e.g., active side). In some implementations, the method couples the back side of the first die to the first surface of the substrate using a bonding agent (e.g., glue). Stage 3 of FIG. 10A illustrates an example of coupling a first die.

The method provides (at 1115) a first encapsulation layer on the substrate. In some implementations, the first encapsulation layer is a photo-etchable material. In some implementations, providing the first encapsulation layer includes forming the first encapsulation layer on the first surface of the substrate and the first die. In some implementations, one or more interconnects (e.g., vias) may be formed in the first encapsulation layer. The interconnects may be formed before or after the first encapsulation layer is formed on the substrate. Stage 4 of FIG. 10B illustrates an example of providing a first encapsulation layer.

The method provides (at 1120) a first redistribution portion. The first redistribution portion may include one or more dielectric layers and one or more redistribution interconnects. In some implementations, providing the first redistribution portion includes forming one or more dielectric layers and one or more redistribution interconnects on the first encapsulation layer. In some implementations, the redistribution interconnects may couple the first die to interconnects in the first encapsulation layer. Stages 5-6 of FIG. 10B illustrate an example of providing a first redistribution portion.

The method couples (at 1125) a second die to a second surface of the substrate. In some implementations, the second die has a back side and front side (e.g., active side). In some implementations, the method couples the back side of the second die to the second surface of the substrate using a bonding agent (e.g., glue). Stage 7 of FIG. 10B illustrates an example of coupling a second die.

The method provides (at 1130) a second encapsulation layer on the substrate. In some implementations, the second encapsulation layer is a photo-etchable material. In some implementations, providing the second encapsulation layer includes forming the second encapsulation layer on the second surface of the substrate and the second die. In some implementations, one or more interconnects (e.g., vias) may be formed in the second encapsulation layer. The interconnects may be formed before or after the second encapsulation layer is formed on the substrate. Stages 8-10 of FIG. 10B illustrate an example of providing a second encapsulation layer.

The method provides (at 1135) a second redistribution portion. The second redistribution portion may include one or more dielectric layers and one or more redistribution interconnects. In some implementations, providing the second redistribution portion includes forming one or more dielectric layers, one or more redistribution interconnects, and/or one or more under bump metallization (UBM) layers on the second encapsulation layer. In some implementations, the redistribution interconnects may couple the second die to interconnects in the second encapsulation layer. Stage 11 of FIG. 10B to stage 14 of FIG. 10C illustrate an example of providing a second redistribution portion.

The method then provides (at 1140) a set of solder balls. In some implementations, providing the set of solder balls includes coupling the set of solder balls to an under bump metallization (UBM) layer in the second redistribution portion or a redistribution interconnect in the second redistribution portion. Stage 15 of FIG. 10C illustrates an example of providing a set of solder balls.

Exemplary Interconnects with Seed Layers

Various interconnects (e.g., traces, vias, pads) are described in the present disclosure. These interconnects may be formed in the substrate, the encapsulation layer, and/or the redistribution portion of an integrated device (e.g., integrated package device). In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

FIG. 12 illustrates a detailed profile view of a metal layer formed using a semi-additive patterning (SAP) process. Specifically, FIG. 12 illustrates a first dielectric layer 1202, a second organic dielectric layer 1204, a first seed layer 1220, and a second metal layer 1222. The first seed layer 1220 is a metal layer (e.g., TiCu, TiWCu). In some implementations, the first seed layer 1220 is formed by a first deposition process (e.g., physical vapor deposition (PVD) or plating process). The second metal layer 1222 is formed by a second deposition process (e.g., plating process). The second metal layer 1222 includes a first metal portion layer 1222a and a second metal portion layer 1222b. In some implementations, the first metal portion layer 1222a is a metal trace. In some implementations, the second metal portion 1222b is a via/via structure. As shown in FIG. 12, the first seed layer 1220 is formed in a base portion of the second metal layer 1222. FIG. 12 illustrates that the first seed layer 1220 is not formed in the side planar portion of the second metal layer 1222. More specifically, FIG. 12 illustrates that the first seed layer 1220 is formed on the base portion (e.g., bottom portion) of the second metal layer 1222, but not on the boundary side portions of the second metal layer 1222. As described above, the second metal layer 1222 includes a first metal portion layer 1222a and a second metal portion layer 1222b. The first seed layer 1220 is formed on the base portion of both the first metal portion layer 1222a and the second metal portion layer 1222b. The first seed layer 1220 is formed on the side portion/wall of the second metal portion layer 1222b (e.g., side portion/wall of the via/via structure), but not on the side portion/wall boundary of the first metal portion layer 1222a. The metal layers may be formed using a semi-additive patterning (SAP) process. As mentioned above, FIGS. 14-15 illustrate an example of a semi-additive patterning (SAP) process in some implementations.

FIG. 13 illustrates a detailed profile view of a metal layer formed using a damascene process. Specifically, FIG. 13 illustrates a first dielectric layer 1302 (e.g., inorganic dielectrics, polymer), a second dielectric layer 1304 (e.g., inorganic dielectrics, polymer), a first seed layer 1320, a second metal layer 1322, a third seed layer 1340, and a fourth metal layer 1342. The first seed layer 1320 and/or the third seed layer 1340 are metal layers (e.g., TiTiN/Cu, TaTaN/Cu). In some implementations, the first seed layer 1320 and/or the third seed layer 1340 are formed by a first deposition process (e.g., chemical vapor deposition (CVP) or physical vapor deposition (PVD)). The second metal layer 1322 and/or the fourth metal layer 1342 are formed by a second deposition process (e.g., plating process). As shown in FIG. 13, the first seed layer 1320 is formed in a base horizontal planar portion and a side planar portion (e.g., vertical planar portion) of the second metal layer 1322. Similarly, the third seed layer 1340 is formed in a base horizontal planar portion and a side planar portions (e.g., vertical planar portions) of the fourth metal layer 1342. As mentioned above, FIGS. 16-17 illustrate an example of a damascene process in some implementations.

Exemplary Semi-Additive Patterning (SAP) Process

FIG. 14 illustrates a sequence for forming an interconnect using a semi-additive patterning (SAP) process to provide and/or form an interconnect (e.g., trace, via) in one or more dielectric layer(s). As shown in FIG. 14, stage 1 illustrates a state of an integrated device (e.g., substrate) after a dielectric layer 1402 is provided (e.g., formed). In some implementations, stage 1 illustrates that the dielectric layer 1402 includes a first metal layer 1404. The first metal layer 1404 is a seed layer in some implementations. In some implementations, the first metal layer 1404 may be provided (e.g., formed) on the dielectric layer 1402 after the dielectric layer 1402 is provided (e.g., received or formed). Stage 1 illustrates that the first metal layer 1404 is provided (e.g., formed) on a first surface of the dielectric layer 1402. In some implementations, the first metal layer 1404 is provided by using a deposition process (e.g., PVD, CVD, plating process).

Stage 2 illustrates a state of the integrated device after a photo resist layer 1406 (e.g., photo develop resist layer) is selectively provided (e.g., formed) on the first metal layer 1404. In some implementations, selectively providing the resist layer 1406 includes providing a first resist layer 1406 on the first metal layer 1404 and selectively removing portions of the resist layer 1406 by developing (e.g., using a development process). Stage 2 illustrates that the resist layer 1406 is provided such that a cavity 1408 is formed.

Stage 3 illustrates a state of the integrated device after a second metal layer 1410 is formed in the cavity 1408. In some implementations, the second metal layer 1410 is formed over an exposed portion of the first metal layer 1404. In some implementations, the second metal layer 1410 is provided by using a deposition process (e.g., plating process).

Stage 4 illustrates a state of the integrated device after the resist layer 1406 is removed. Different implementations may use different processes for removing the resist layer 1406.

Stage 5 illustrates a state of the integrated device after portions of the first metal layer 1404 are selectively removed. In some implementations, one or more portions of the first metal layer 1404 that is not covered by the second metal layer 1410 is removed. As shown in stage 5, the remaining first metal layer 1404 and the second metal layer 1410 may form and/or define an interconnect 1412 (e.g., trace, vias, pads) in an integrated device and/or a substrate. In some implementations, the first metal layer 1406 is removed such that a dimension (e.g., length, width) of the first metal layer 1404 underneath the second metal layer 1410 is smaller than a dimension (e.g., length, width) of the second metal layer 1410, which can result in an undercut, as shown at stage 5 of FIG. 14. In some implementations, the above mentioned processes may be iterated several times to provide and/or form several interconnects in one or more dielectric layers of an integrated device and/or substrate.

FIG. 15 illustrates a flow diagram for a method for using a (SAP) process to provide and/or form an interconnect in one or more dielectric layer(s). The method provides (at 1505) a dielectric layer (e.g., dielectric layer 1402). In some implementations, providing the dielectric layer includes forming the dielectric layer. In some implementations, providing the dielectric layer includes forming a first metal layer (e.g., first metal layer 1404). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1510) a photo resist layer (e.g., a photo develop resist layer 1406) on the first metal layer. In some implementations, selectively providing the resist layer includes providing a first resist layer on the first metal layer and selectively removing portions of the resist layer (which provides one or more cavities).

The method then provides (at 1515) a second metal layer (e.g., second metal layer 1410) in the cavity of the photo resist layer. In some implementations, the second metal layer is formed over an exposed portion of the first metal layer. In some implementations, the second metal layer is provided by using a deposition process (e.g., plating process).

The method further removes (at 1520) the resist layer. Different implementations may use different processes for removing the resist layer. The method also selectively removes (at 1525) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

FIG. 16 illustrates a sequence for forming an interconnect using a damascene process to provide and/or form an interconnect in a dielectric layer. As shown in FIG. 16, stage 1 illustrates a state of an integrated device after a dielectric layer 1602 is provided (e.g., formed). In some implementations, the dielectric layer 1602 is an inorganic layer (e.g., inorganic film).

Stage 2 illustrates a state of an integrated device after a cavity 1604 is formed in the dielectric layer 1602. Different implementations may use different processes for providing the cavity 1604 in the dielectric layer 1602.

Stage 3 illustrates a state of an integrated device after a first metal layer 1606 is provided on the dielectric layer 1602. As shown in stage 3, the first metal layer 1606 provided on a first surface of the dielectric later 1602. The first metal layer 1606 is provided on the dielectric layer 1602 such that the first metal layer 1606 takes the contour of the dielectric layer 1602 including the contour of the cavity 1604. The first metal layer 1606 is a seed layer in some implementations. In some implementations, the first metal layer 1606 is provided by using a deposition process (e.g., physical vapor deposition (PVD), Chemical Vapor Deposition (CVP) or plating process).

Stage 4 illustrates a state of the integrated device after a second metal layer 1608 is formed in the cavity 1604 and a surface of the dielectric layer 1602. In some implementations, the second metal layer 1608 is formed over an exposed portion of the first metal layer 1606. In some implementations, the second metal layer 1608 is provided by using a deposition process (e.g., plating process).

Stage 5 illustrates a state of the integrated device after the portions of the second metal layer 1608 and portions of the first metal layer 1606 are removed. Different implementations may use different processes for removing the second metal layer 1608 and the first metal layer 1606. In some implementations, a chemical mechanical planazation (CMP) process is used to remove portions of the second metal layer 1608 and portions of the first metal layer 1606. As shown in stage 5, the remaining first metal layer 1606 and the second metal layer 1608 may form and/or define an interconnect 1612 (e.g., trace, vias, pads) in an integrated device and/or a substrate. As shown in stage 5, the interconnect 1612 is formed in such a way that the first metal layer 1606 is formed on the base portion and the side portion(s) of the second metal layer 1610. In some implementations, the cavity 1604 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

FIG. 17 illustrates a flow diagram of a method for forming an interconnect using a damascene process to provide and/or form an interconnect in a dielectric layer. The method provides (at 1705) a dielectric layer (e.g., dielectric layer 1602). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1710) at least one cavity (e.g., cavity 1604) in the dielectric layer. Different implementations may use different processes for providing the cavity in the dielectric layer.

The method provides (at 1715) a first metal layer (e.g., first metal layer 1606) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 1606 is provided by using a deposition process (e.g., PVD, CVD or plating process).

The method provides (at 1720) a second metal layer (e.g., second metal layer 1608) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1725) portions of the second metal layer and portions of the first metal layer. Different implementations may use different processes for removing the second metal layer and the first metal layer. In some implementations, a chemical mechanical planazation (CMP) process is used to remove portions of the second metal layer and portions of the first metal layer. In some implementations, the remaining first metal layer and the second metal layer may form and/or define an interconnect (e.g., interconnect 1612). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

FIG. 18 illustrates various electronic devices that may be integrated with any of the aforementioned integrated device, semiconductor device, integrated circuit, die, interposer, package or package-on-package (PoP). For example, a mobile telephone 1802, a laptop computer 1804, and a fixed location terminal 1806 may include an integrated device 1800 as described herein. The integrated device 1800 may be, for example, any of the integrated circuits, dice, packages, package-on-packages described herein. The devices 1802, 1804, 1806 illustrated in FIG. 18 are merely exemplary. Other electronic devices may also feature the integrated device 1800 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8A-8B, 9A-9B, 10A-10C, 11, 12, 13, 14, 15, 16, 17, and/or 18 may be rearranged and/or combined into a single component, step, feature or function or embodied in several components, steps, or functions. Additional elements, components, steps, and/or functions may also be added without departing from the invention. It should also be noted that FIGS. 2, 3, 4, 5, 6, 7, 8A-8B, 9A-9B, 10A-10C, 11, 12, 13, 14, 15, 16, 17, and/or 18 and its corresponding description in the present disclosure is not limited to dies and/or ICs. In some implementations, FIGS. 2, 3, 4, 5, 6, 7, 8A-8B, 9A-9B, 10A-10C, 11, 12, 13, 14, 15, 16, 17, and/or 18 and its corresponding description may be used to manufacture, create, provide, and/or produce integrated devices. In some implementations, an integrated device may include a die, a die package, an integrated circuit (IC), integrated package device, a wafer, a semiconductor device, a package on package, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a substrate comprising a first surface and a second surface, wherein the substrate further comprises a capacitor;
   a first die coupled to the first surface of the substrate;
   a first encapsulation layer encapsulating the first die;
   a first redistribution portion coupled to the first encapsulation layer;
   a second die coupled to the second surface of the substrate;
   a second encapsulation layer encapsulating the second die; and
   a second redistribution portion coupled to the second encapsulation layer.

2. The integrated device of claim 1, wherein the capacitor comprises one of at least a plate capacitor and/or an embedded package substrate (EPS) capacitor.

3. The integrated device of claim 1, wherein the first redistribution portion includes a redistribution interconnect.

4. The integrated device of claim 1, wherein the first encapsulation layer includes a through encapsulation via.

5. The integrated device of claim 1, wherein the first encapsulation layer comprises a photo-etchable material.

6. The integrated device of claim 1, wherein the substrate is a hybrid substrate that includes a first dielectric layer and a second dielectric layer.

7. The integrated device of claim 6, wherein the second dielectric layer has a second k value that is substantially greater than the first k value of the first dielectric layer.

8. The integrated device of claim 1 further comprising:
   a first redistribution interconnect in the first redistribution portion, the first redistribution portion coupled to the first die through a first die interconnect;
   a first through encapsulation via (TEV) in the first encapsulation layer, the first TEV coupled to the first redistribution interconnect;
   a first via in the substrate, the first via coupled to the first TEV;
   a first pad in the substrate, the first pad coupled to the first via;
   a second TEV in the second encapsulation layer, the second TEV coupled to the first pad; and
   a second redistribution interconnect in the second redistribution portion, the second redistribution interconnect coupled to the second TEV.

9. The integrated device of claim 1, wherein the integrated device is one of at least a package and/or package on package (POP) device.

10. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. A method for fabricating an integrated device, comprising:
    providing a substrate comprising a first surface and a second surface, wherein the substrate further comprises a capacitor;
    coupling a first die to the first surface of the substrate;
    forming a first encapsulation layer that encapsulates the first die;
    forming a first redistribution portion on the first encapsulation layer;
    coupling a second die to the second surface of the substrate;
    forming a second encapsulation layer that encapsulates the second die; and
    forming a second redistribution portion on the second encapsulation layer.

12. The method of claim 11, wherein the capacitor comprises one of at least a plate capacitor and/or an embedded package substrate (EPS) capacitor.

13. The method of claim 11, wherein forming the first redistribution portion includes forming a redistribution interconnect.

14. The method of claim 11, wherein forming the first encapsulation layer includes forming a through encapsulation via.

15. The method of claim 11, wherein the first encapsulation layer comprises a photo-etchable material.

16. The method of claim 11, wherein providing the substrate comprises providing a hybrid substrate that includes a first dielectric layer and a second dielectric layer.

17. The method of claim 16, wherein the second dielectric layer has a second k value that is substantially greater than the first k value of the first dielectric layer.

18. The method of claim 11 further comprising:
    forming a first redistribution interconnect in the first redistribution portion such that the first redistribution portion is coupled to the first die through a first die interconnect;
    forming a first through encapsulation via (TEV) in the first encapsulation layer such that the first TEV is coupled to the first redistribution interconnect;
    forming a first via in the substrate such that the first via is coupled to the first TEV;
    forming a first pad in the substrate such that the first pad is coupled to the first via;
    forming a second TEV in the second encapsulation layer such that the second TEV is coupled to the first pad; and
    forming a second redistribution interconnect in the second redistribution portion such that the second redistribution interconnect is coupled to the second TEV.

19. The method of claim 11, wherein the integrated device is one of at least a package and/or package on package (POP) device.

20. The method of claim 11, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *